(12) United States Patent
Mutaguchi

(10) Patent No.: US 7,245,690 B2
(45) Date of Patent: Jul. 17, 2007

(54) SHIFT REGISTER AND ELECTRONIC DEVICE USING THE SAME

(75) Inventor: Kohei Mutaguchi, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 66 days.

(21) Appl. No.: 11/132,446

(22) Filed: May 19, 2005

(65) Prior Publication Data

US 2005/0276369 A1 Dec. 15, 2005

(30) Foreign Application Priority Data

May 20, 2004 (JP) ............................. 2004-150284

(51) Int. Cl.
*G11C 19/00* (2006.01)

(52) U.S. Cl. ..................... 377/64; 377/75; 377/77; 345/93

(58) Field of Classification Search ............... None
See application file for complete search history.

(56) References Cited

U.S. PATENT DOCUMENTS

| | | | |
|---|---|---|---|
| 4,025,772 A | 5/1977 | Constant | |
| 4,371,953 A | 2/1983 | Hyatt | |
| 4,598,388 A | 7/1986 | Anderson | |
| 4,646,289 A | 2/1987 | Tsiakas et al. | |
| 4,658,287 A | 4/1987 | Chen | |
| 4,680,457 A | 7/1987 | Robertson | |
| 4,947,410 A | 8/1990 | Lippmann et al. | |
| 5,038,368 A * | 8/1991 | Lee ............................. | 377/28 |
| 5,063,378 A | 11/1991 | Roach | |
| 5,111,060 A | 5/1992 | Asada | |
| 5,253,255 A | 10/1993 | Carbine | |
| 5,255,226 A | 10/1993 | Ohno et al. | |
| 5,465,053 A | 11/1995 | Edwards | |
| 5,654,970 A | 8/1997 | DaCosta et al. | |
| 5,708,455 A | 1/1998 | Maekawa | |
| 5,736,733 A | 4/1998 | Shima et al. | |
| 5,781,171 A | 7/1998 | Kihara et al. | |
| 5,859,627 A | 1/1999 | Hoshiya et al. | |
| 5,889,504 A * | 3/1999 | Kihara et al. ............... | 345/100 |
| 5,926,156 A * | 7/1999 | Katoh et al. .................. | 345/55 |

(Continued)

FOREIGN PATENT DOCUMENTS

JP 06-083286 3/1994

(Continued)

*Primary Examiner*—Tuan T. Lam
(74) *Attorney, Agent, or Firm*—Eric J. Robinson; Robinson Intellectual Property Law Office

(57) ABSTRACT

The invention provides a shift register which can function normally even with an abnormal register or a broken register while suppressing the manufacturing cost as little as possible. The shift register of the invention includes n regular registers (SR(1) to SR(n)) connected in series and n output lines (L1 to Ln) corresponding to the n regular registers, r (r≦n) redundant registers (SR(n+1) to SR(n+r)) connected in series to the n regular registers, and a switch circuit for selectively connecting the regular and redundant resistors to output lines. The switch circuit connects the n regular registers to the corresponding output lines in a normal state, connects normal registers of upper and lower stages of the broken register by skipping and disabling the broken register if any, and connects normal regular registers and the same number of redundant registers as the broken registers to the n output lines.

28 Claims, 15 Drawing Sheets

U.S. PATENT DOCUMENTS

| | | |
|---|---|---|
| 5,953,284 A | 9/1999 | Baker et al. |
| 5,956,008 A | 9/1999 | Kawasaki et al. |
| 6,144,356 A | 11/2000 | Weatherford et al. |
| 6,301,322 B1 | 10/2001 | Manning |
| 6,345,085 B1 | 2/2002 | Yeo et al. |
| 6,670,944 B1 | 12/2003 | Ishii |
| 6,747,627 B1 | 6/2004 | Koyama et al. |

FOREIGN PATENT DOCUMENTS

| | | |
|---|---|---|
| JP | 0601649 | 6/1994 |
| JP | 06-281944 | 10/1994 |

* cited by examiner

SHIFT REGISTER AND ELECTRONIC DEVICE USING THE SAME

BACKGROUND OF THE INVENTION

1. Field of the Invention

The present invention relates to a shift register and an electronic device using the same.

2. Description of the Related Art

In an active matrix display device such as a liquid crystal display device (LCD) and an EL panel, a shift register is used as a driver circuit (scan line driver circuit and signal line driver circuit) for reducing the number of signal input terminals. A shift register is configured by a plurality of registers connected in series. A signal inputted in each register is transferred to a next register according to a clock signal.

In such a driver circuit, a transistor which forms a register in a shift register may be abnormal (or broken) by static electricity and the like. In such a case, a signal is not transferred to a register of lower stage than the abnormal register (or broken register), which causes a defect in display. Such a display device cannot be shipped as a product, thus manufacturing yield is reduced. In view of this, a redundant structure is employed in which a plurality of shift registers are connected in parallel so that a driver circuit can function normally even when a register in the shift register is broken (see Patent Document 1). In the case of connecting two shift registers in parallel, for example, when a register of one shift register is broken, a corresponding register of the other shift register can be used instead. Thus a driver circuit can keep operating normally.

[Patent Document 1] Japanese Patent Laid-Open No. 6-83286

SUMMARY OF THE INVENTION

A plurality of shift registers connected in parallel, however, could lead to increase the manufacturing cost of a driver circuit and a display device using the driver circuit. In particular, it is quite unlikely that a plurality of registers are broken in one shift register, therefore, many of the registers in the shift registers connected in parallel end up in waste. Accordingly, it is one of the features of the invention to provide a shift register which can function normally even when part of the registers is broken while suppressing the increase in manufacturing cost as little as possible, and to provide an electronic device using the shift register.

It is another feature of the invention to provide a shift register which can operate normally by a simple operation without being affected by a broken register, and to provide an electronic device using the shift register.

In view of the aforementioned, according to the invention, a shift register includes n ($n \geq 1$) regular registers (SR(1) to SR(n)) connected in series, n output lines (L1 to Ln) corresponding to the n regular registers, r ($n \geq r \geq 1$) redundant registers (SR(n+1) to SR(n+r)) connected to the n regular registers in series, and a switch circuit (2, 12, and 102) for selectively connecting the (n+r) regular registers and redundant registers to n output lines. The switch circuit normally connects the n regular registers to the corresponding output lines in a normal state. When there is a broken register, the switch circuit connects a normal register of upper stage than the broken register to a normal register of lower stage than the broken register by skipping and disabling the broken register. Further, the switch circuit connects normal registers among the regular registers and the same number of redundant registers as the broken transistors to the n output lines.

Preferably, the switch circuit includes first, second, third terminals (a, b, and c), a control terminal, and (n+r) first switches (S(1) to S(n+1), S (1, 1) to S(1, n+2)) in which the first terminal can be selectively connected to one of the second and third terminals according to a control signal inputted to the control terminal. A first terminal of each of the first switches is connected to one corresponding output terminal of the (n+r) registers. A third terminal of a switch of upper stage of a pair of adjacent switches is connected to a second terminal of a switch of lower stage, a second terminal of the first switch of a top stage is connected to an input terminal of the shift register. The first switch of bottom stage may be substituted by a switch having only a first terminal and a second terminal. The aforementioned first switch can be formed by using an appropriate switching element such as a transmission gate, a MOSFET, a bipolar transistor and the like.

More preferably, a switch circuit includes disable circuits (D(1) to D(n+1)) which determine a state of each register from a state of the first switch, and then disable a register determined as broken. In the case where a buffer (20) is connected to each output of the register, the disable circuit stops an operation voltage ($V_{CC}$ and $V_{GND}$) supply to the buffer corresponding to the broken register, thereby an output of the broken register becomes electrically floating.

More preferably, a switch circuit includes a first control signal line (13 and 103) formed of a conducting wire of which one end is connected to a low voltage source ($V_{GND}$) and the other end is connected to a high voltage source ($V_{CC}$). Each control terminal of the first switch is connected to the first control signal line sequentially. In a normal state, a voltage from one of the high voltage source and the low voltage source is supplied as a control signal to each control terminal of the first switch. By cutting off the control signal line between the selected first switch and a first switch of one lower stage, a voltage from the other of the high voltage source and the low voltage source is supplied as a control signal to the first switches of one lower stage. It is preferable that the first control line be formed of a fuse.

In the case where r is 1 (that is, one redundant register is provided), n output lines are each connected to a third terminal of the corresponding first switch and a second terminal of the first switch of one lower stage.

In the case where r is 2 (that is, two redundant registers are provided), each switch circuit includes first, second, third terminals and a control terminal, and (n+1) second switches (S(2, 1) to S(2, n+1)) in which the first terminal can be selectively connected to one of the second and third terminals according to a control signal inputted to the control terminal. A first terminal of each second switch is connected to a third terminal of a corresponding first switch and a second terminal of a first switch of one stage lower. A third terminal of a switch of upper stage of a pair of adjacent switches is connected to a second terminal of a switch of lower stage. N output lines are each connected to a third terminal of a corresponding second switch and a second terminal of a second switch of the lower stage. A second terminal of a first switch of a top stage is connected to an input terminal of the shift register.

In the case where two redundant registers are provided, a switching circuit preferably includes first and second control signal lines (103 and 104) formed of conducting wires each of which has one end connected to a low voltage source ($V_{GND}$) and the other end connected to a high voltage source ($V_{CC}$). Each control terminal of the first switch is sequentially connected to the first control signal line. In a normal state, a voltage from one of the high voltage source and the low voltage source is supplied as a control signal to each control terminal of the first switch. Each control terminal of the second switch is sequentially connected to the second control signal line. In a normal state, a voltage from one of the high voltage source and the low voltage source is supplied as a control signal to each control terminal of the second switch. By cutting off the second control signal line between the selected first switch and a first switch of one lower stage, a voltage from the other of the high voltage source and the low voltage source is supplied as a control signal to the first switches of one lower stage. By cutting off the second control signal line between the selected second switch and a second switch of one lower stage, a voltage from the other of the high voltage source and the low voltage source is supplied as a control signal of the second switch of one lower stage. One or both of the first control line and the second control line can be preferably formed of a fuse.

It is to be noted that the number r of the redundant registers may be three or more as well as one or two.

According to the invention, an electronic device including the aforementioned shift register is provided. More preferably, an electronic device includes a display device (200) which has driver circuits (220 and 230) to which the shift register is applied.

The shift register according to the invention includes r (r is a natural number of one or more) redundant registers connected in series to regular registers, and a switch circuit which selectively connects these regular registers and redundant registers to output lines. Therefore, even when some of the regular registers are broken, a normal operation can be obtained by using the same number of redundant registers as the broken regular registers when the number of the broken regular registers is r or less. Moreover, as it is quite unlikely that all the regular registers are broken, the redundant registers are not required to be provided as many as the regular registers, which can minimize the increase in manufacturing cost. The switch circuit connects normal registers of the upper and lower stages of the broken register by skipping and disabling the broken register, therefore, the broken register does not adversely affect an operation of the normal register.

The aforementioned switch circuit includes first, second, third terminals and a control terminal, (n+r) first switches which can selectively connect to one of the first, second, and third terminals in accordance with a control signal inputted to the control terminal. A first terminal of each first switch is connected to one corresponding output terminal of the (n+r) registers. A third terminal of a switch of upper stage of a pair of adjacent switches is connected to a second terminal of a switch of lower stage, and a second terminal of a first switch of top stage is connected to an input terminal of the shift register. By setting a state of the first switch appropriately, the normal register and redundant registers can be connected to output lines appropriately as well as skipping the broken register and connecting normal registers of the upper and lower stages thereof.

The switch circuit including a disable circuit which determines a state of each register from a state of the first switch and disables the register determined to be broken can disable the broken register favorably. Normally, an output of each register is connected to a buffer. The disable circuit stops an operation voltage supply to a buffer corresponding to the broken register, thereby an output of the broken transistor becomes electrically floating to prevent an adverse effect to the normal registers.

Provided that a switch circuit further includes a first control signal line formed of a conducting wire of which one end is connected to a low voltage source and the other end is connected to a high voltage source, each control terminal of the first switch is sequentially connected to a first control signal line, and a voltage from one of the high voltage source and the low voltage source is supplied as a control signal to the each control terminal of the first switch in a normal state, by cutting off the control signal line between the selected first switch and the first switch of one stage lower, a voltage from the other of the high voltage source and the low voltage source can be supplied as a control signal to the first switch of lower stage than the selected first switch. The selected first switch is determined appropriately according to the broken register. Accordingly, by simply cutting off the first control signal line, a control signal to be inputted to the first switch of lower stage than the selected first switch can be changed to change states of the switches. Thus, the broken register can be skipped and normal registers (regular register and redundant register) can be appropriately connected to output lines. When the first control signal line is formed of a fuse, the fuse can be melted to be cut off by a simple operation such as laser light irradiation, for example.

Provided that r is 1 (that is, one redundant register is provided) and n output lines are each connected to a third terminal of the corresponding first switch and a second terminal of the first switch of one stage lower than that, a shift register which can operate normally with one broken register can be provided.

Provided that r is 2 (that is, two redundant registers are provided), the switch circuit further includes first, second, third terminals and a control terminal, (n+1) second switches in which the first terminal can be selectively connected to one of the second and third terminals according to a control signal inputted to a control terminal, a first terminal of each second switch is connected to a third terminal of the corresponding first switch and a second terminal of the first switch of one lower stage, a third terminal of a switch of upper stage of a pair of adjacent switches is connected to a second terminal of a switch of lower stage, each of n output lines is connected to a third terminal of the corresponding second switch and a second terminal of a second switch of one lower stage, and a second terminal of the second switch of top stage is connected to an input terminal of the shift register, a shift register which can operate normally with two broken registers can be provided.

In the aforementioned shift register which can operate normally with up to two broken registers, provided that the switch circuit includes first and second control signal lines formed of conducting wires each of which has one end connected to the low voltage source ($V_{GND}$) and the other end connected to the high voltage source ($V_{CC}$), each control terminal of the first switch is sequentially connected to the first control signal line, a voltage from one of the high voltage source and the low voltage source is supplied as a control signal to each control terminal of the first switch in a normal state, each control terminal of the second switch is sequentially connected to the second control signal line, and a voltage from one of the high voltage source and the low voltage source is supplied to each control terminal of the second switch in a normal state, the states of the first and/or second switches can be changed appropriately by a simple operation to cut off an appropriate part of the first control signal line and/or the second control signal line, thereby the broken register can be skipped and normal registers (regular registers and redundant registers) can be appropriately connected to output lines.

An electronic device formed by using the aforementioned shift register can increase the manufacturing yield as well as improving the reliability of the electronic device while suppressing the manufacturing cost as little as possible. When the electronic device includes a display device, in particular, an electronic device having high reliability which can operate normally even with some broken registers in the shift registers by using the aforementioned shift register in a driver circuit (a scan line driver circuit and/or a signal line driver circuit) of the display device.

DETAILED DESCRIPTION OF THE INVENTION

Hereinafter described with reference to drawings is an embodiment mode of the invention.

Figure 1:
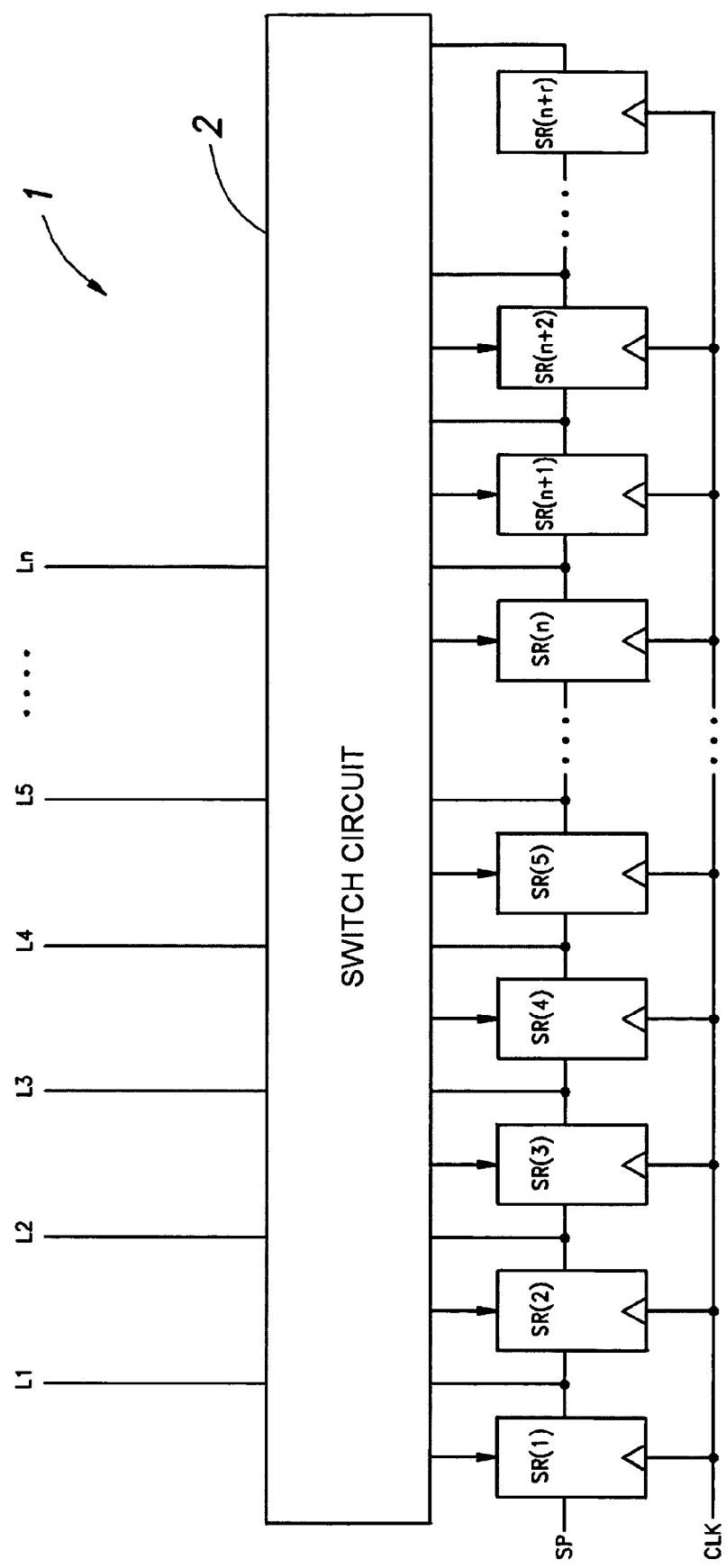
FIG. 1 is a block diagram showing a preferred embodiment mode of the shift register of the invention.
Figure 2:
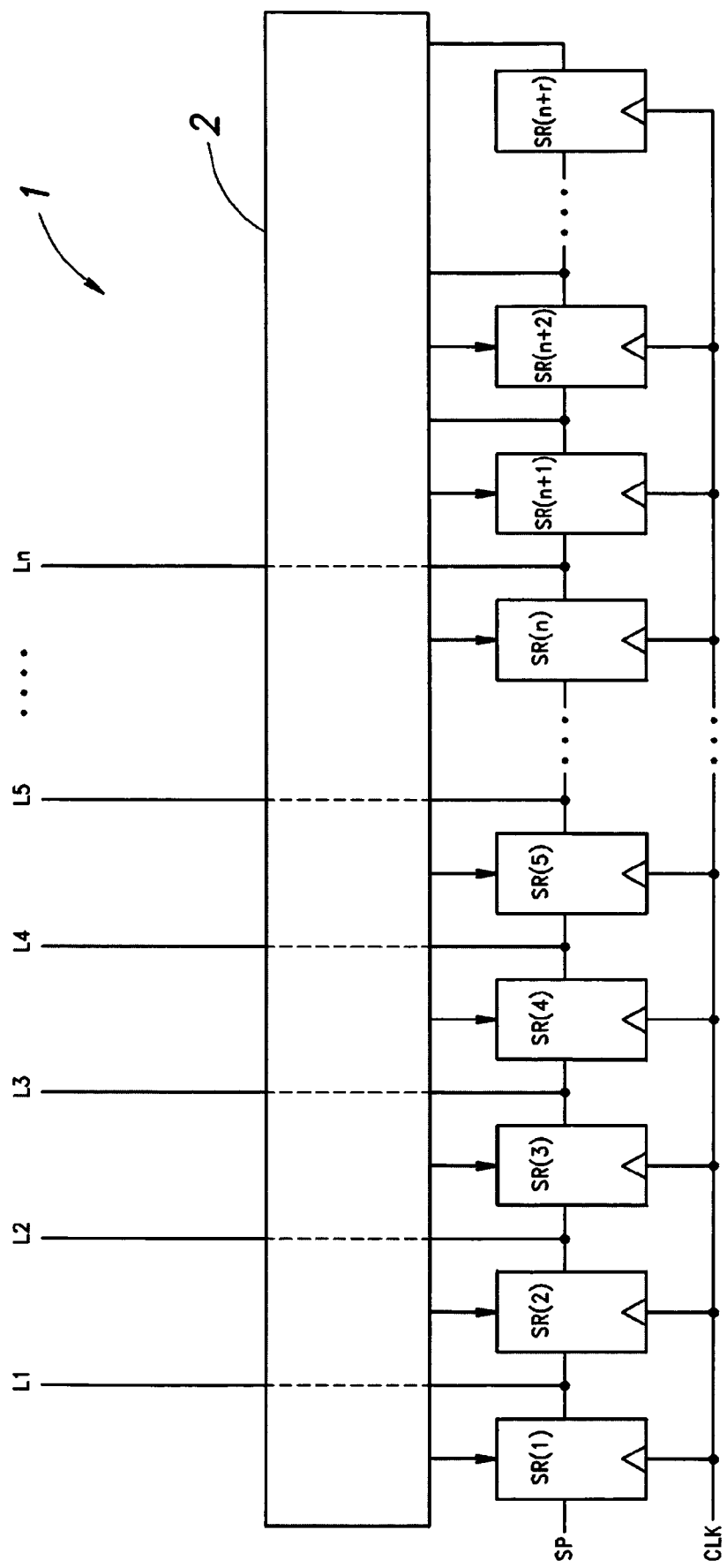
FIG. 2 is a block diagram showing an operation of a switch circuit of the shift register shown in FIG. 1 in a normal state.
Figure 3:
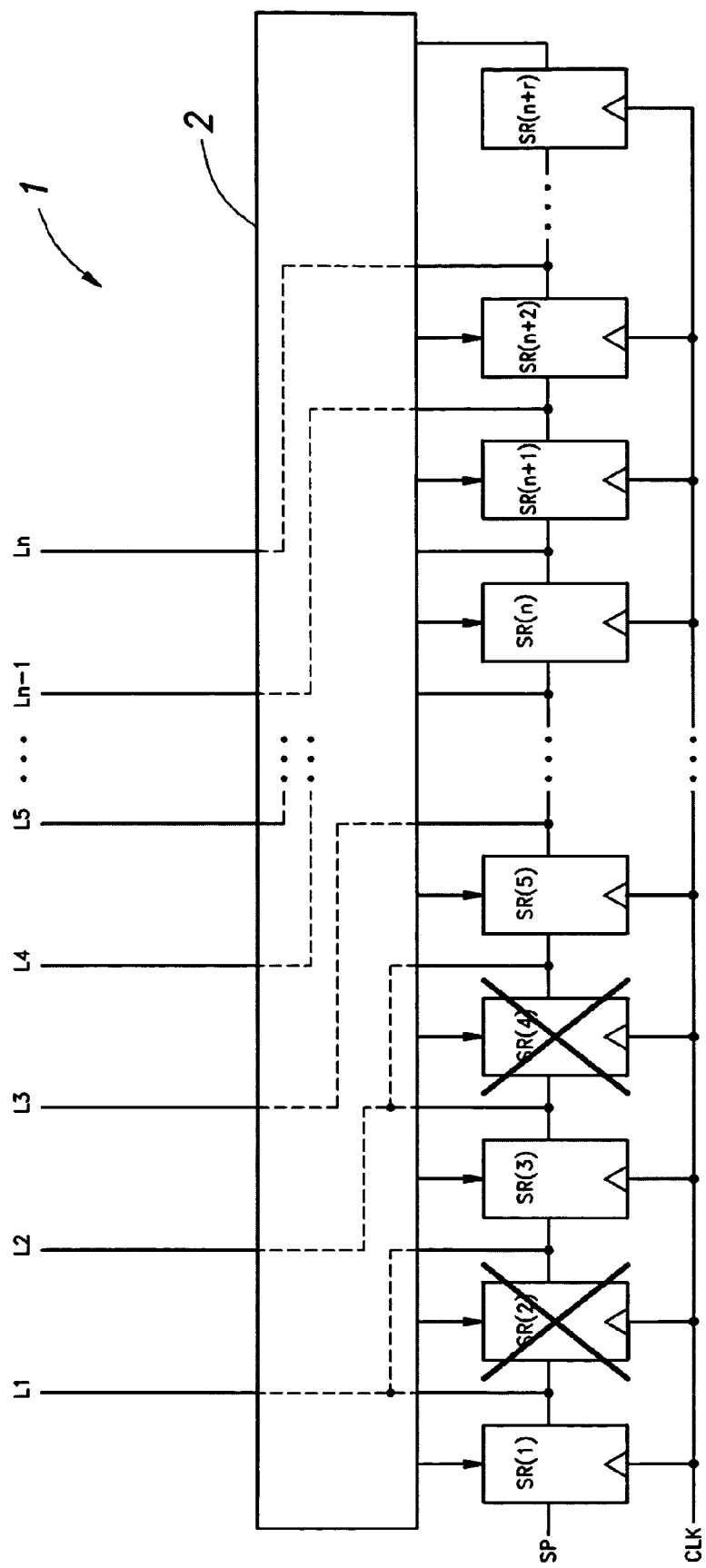
FIG. 3 is a block diagram showing an operation of a switch circuit of the shift register shown in FIG. 1 in the case where two registers are broken.

FIG. 1 is a block diagram showing a preferred embodiment mode of the shift register according to the invention. A shift register 1 includes n regular registers SR(1) to SR(n) connected in series and n output lines L1 to Ln corresponding to the n regular registers SR(1) to SR(n). Further, the shift register 1 includes r redundant registers SR(n+1) to SR(n+r) connected in series to the lower stage of the regular registers SR(1) to SR(n) and a switch circuit 2 provided between the regular and redundant registers SR(1) to SR(n+r) and the output lines L1 to Ln. A clock signal CLK is inputted to the registers SR(1) to SR(n+r). A start pulse SP inputted to the register SR(1) of the input terminal is sent to the register of lower stages in synchronization with the clock signal.

In the case where none of the regular registers SR(1) to SR(n) are broken, the switch circuit 2 connects outputs of the regular registers SR(1) to SR(n) to the corresponding output lines L1 to Ln.

When m (m≦r) registers among the regular registers SR(1) to SR(n) are broken (the broken registers are crossed in the drawing), the switch circuit 2 supplies a signal to the output lines L1 to Ln by using (n−m) normal registers among the regular registers SR(1) to SR(n) and m registers among the redundant registers SR(n+1) to SR(n+r), and the broken registers are skipped to send/receive signals between normal registers of the upper and lower stages. Further, a disable signal is supplied to the broken register so that an output of the broken register does not affect a normal register of lower stage and a signal of an output line connected to a normal register of upper stage.

In the case where the registers SR(2) and SR(4) are broken, the switch circuit 2 controls an output of the register SR(1) to be inputted to a normal register SR(3) which is one stage lower than the broken register SR(2) and an output of the register SR(3) to be supplied to the output line L2. The output of the register SR(3) is inputted to the normal register SR(5) which is one stage lower than the register SR(4). An output of the register SR(5) is connected to an output line L3 which shifted to upper stage by the number of the broken registers (two in this case). Similarly, outputs of the rest of the regular registers SR(6) to SR(n) are connected to the output lines L4 to Ln−2 which are shifted to upper stage by two respectively. Moreover, outputs of the redundant registers in the same number as the broken registers (in this case, SR(n+1) and SR(n+2)) are connected to the rest of the output lines Ln−1 and Ln respectively. The rest of the redundant registers SR(n+3) to SR(n+r) are not used. Further, the switch circuit supplies disable signals to the broken registers SR(2) and SR(4) so that the broken registers SR(2) and SR(4) do not affect the registers SR(3) and SR(5) of lower stages and the signals of the output lines L1 and L2 connected to the registers SR(1) and SR(3) of upper stages.

In this manner, the shift register according to the invention includes r (r is a natural number of one or more) redundant registers connected in series to the regular registers, and a switch circuit which selectively connects these regular registers and redundant registers to output lines. Therefore, a normal operation can be provided even with some broken regular registers by using the redundant registers in the same number as the broken regular registers when the number of broken regular registers is r or less. Moreover, as it is quite unlikely that all the regular registers are broken, the redundant registers are not required to be provided as many as the regular registers, which can minimize the increase in manufacturing cost.

Figure 4:
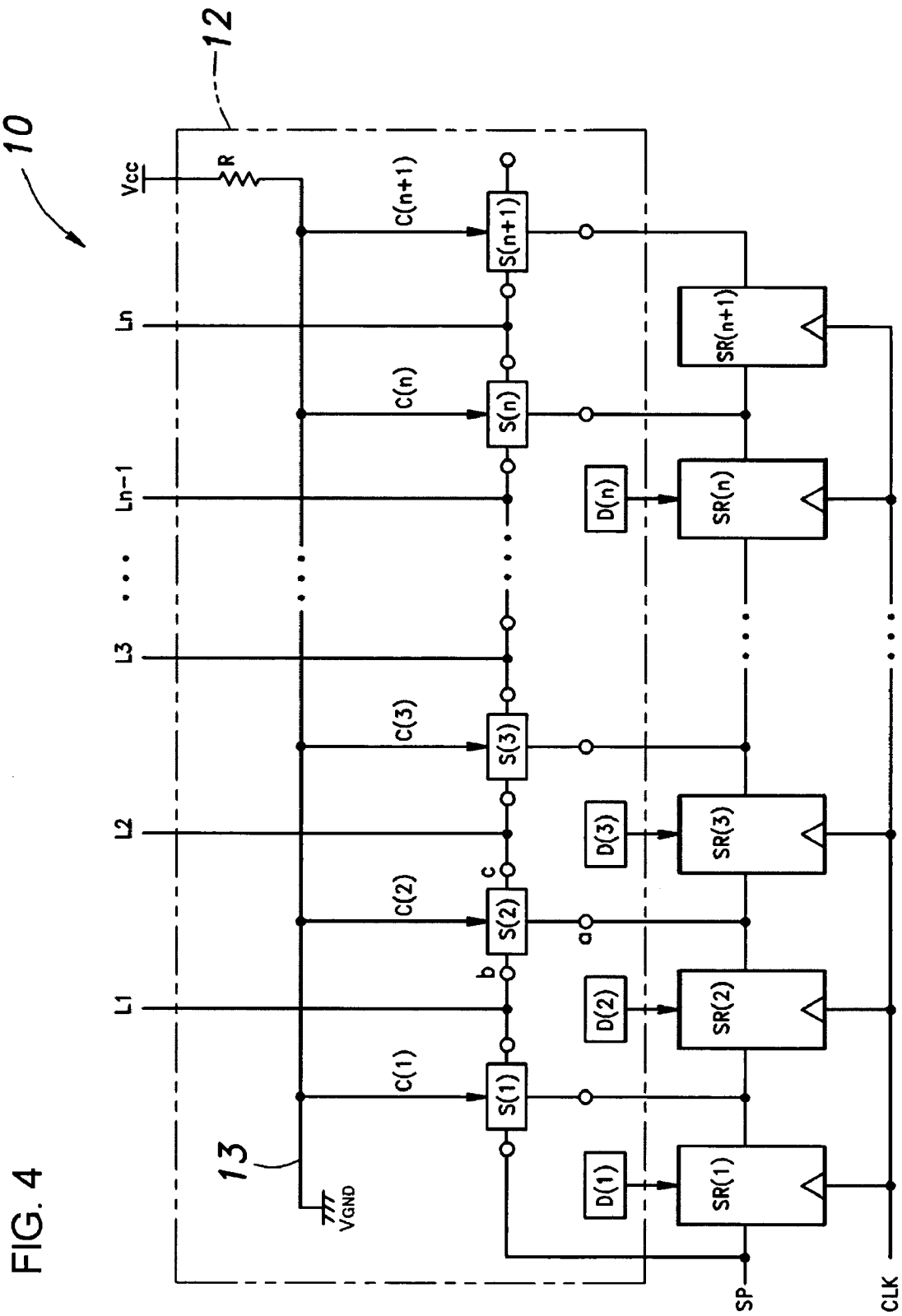
FIG. 4 is a schematic circuit diagram showing a preferred embodiment mode of the shift register of the invention which can operate normally even with one broken register.

FIG. 4 is a schematic diagram showing a specific embodiment mode of the shift register according to the invention. A shift register 10 includes n regular registers SR(1) to SR(n) connected in series, n output lines L1 to Ln corresponding to the regular registers, one redundant register SR(n+1) connected in series to lower stage of the regular registers SR(1) to SR(n), and a switch circuit 12 which selectively connects the regular registers SR(1) to SR(n) and the redundant register SR(n+1) to the output lines L1 to Ln. That is, the shift register 10 can normally operate with one broken register. Clock signals CLK are supplied to the registers SR(1) to SR(n+1). Signals are sent from registers of upper stages to registers of lower stages in synchronization with the clock signals.

The switch circuit 12 includes switches S(1) to S(n+1) connected to each output terminal of the registers SR(1) to SR(n+1) respectively, disable circuits D(1) to D(n) for supplying a disable signal to the regular registers SR(1) to SR(n) as required, and a control signal line 13 for supplying control signals C(1) to C(n+1) to the switches S(1) to S(n+1).

Each of the switches S(1) to S(n+1) includes first, second and third terminals a, b, and c as shown in the switch S(2), and can selectively connect the first terminal a to one of the second terminal b or the third terminal c in accordance with the corresponding control signals C(1) to C(n+1). The first terminal a of each of the switches S(1) to S(n+1) is connected to output terminal of the corresponding registers SR(1) to SR(n+1), the second terminal b is connected to the third terminal c of a switch of upper stage, and the third terminal c is connected to the second terminal b of a switch of lower stage as well as to the corresponding output lines L1 to Ln. In this manner, adjacent switches connected to each other form an array of switches. It is to be noted that a second terminal b of the switch S(1) of top stage is connected to an input terminal of the register SR(1) of the first stage, and a third terminal c of the switch S(n+1) of bottom stage is open. Therefore, the switch S(n+1) may be substituted by a switch having only the first terminal a and the second terminal b without the third terminal c.

Figure 5:
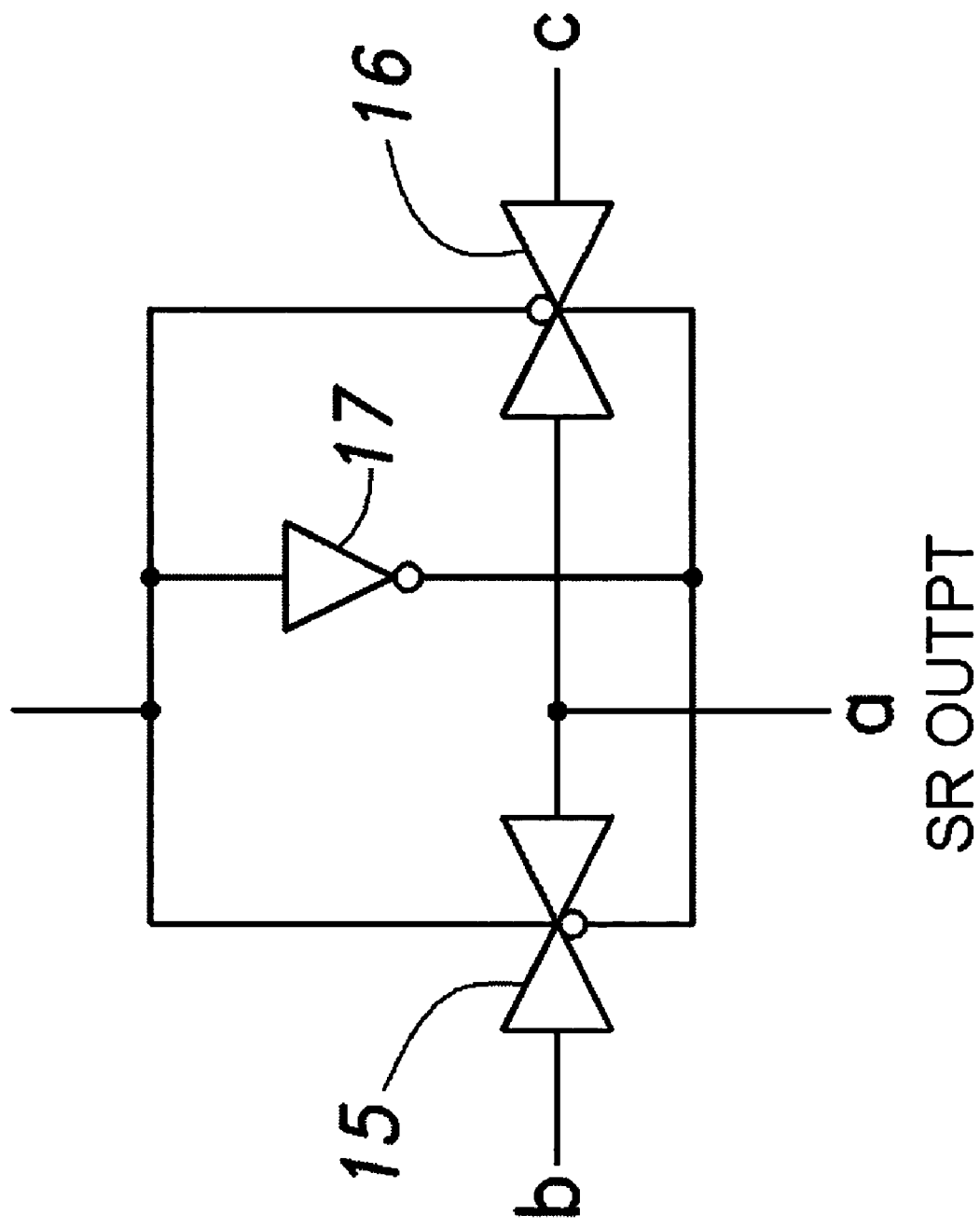
FIG. 5 is a circuit diagram showing a preferred embodiment mode of the switches S(1) to S(n+1) in FIG. 4.

FIG. 5 is a circuit diagram showing a preferred embodiment mode of the switches S(1) to S(n+1). In this switch, a first transmission gate 15 is connected between the first terminal a and the second terminal b and a second transmission gate 16 is connected between the first terminal a and the third terminal c. These two transmission gates 15 and 16 are supplied with a control signal from the control signal line 13 and an inverted signal by the inverter circuit 17. The first transmission gate 15 is turned on and the second transmission gate 16 is turned off when the control signal is high ($V_{CC}$) (that is, the first terminal a is connected to the second terminal b), the first transmission gate 15 is turned off and the second transmission gate 16 is turned on when the control signal is low ($V_{GND}$) (that is, the first terminal a is connected to the third terminal c). It is to be noted that a switch which can be turned on/off such as an FET and a bipolar transistor can be used as well as the transmission gate.

In FIG. 4, the control signal line 13 is preferably formed of a conductor such as a fuse. Each control terminal of the switches S(1) to S(n+1) is connected to the control signal line 13 sequentially from the upper stage to the lower stage. One end of the control signal line 13 is connected to a ground potential $V_{GND}$ as a low voltage source while the other end is connected to an operation potential $V_{CC}$ as a high voltage source through a resistor R. Therefore, in a normal state, the control signals C(1) to C(n+1) of the switches S(1) to S(n+1) are low ($V_{GND}$). Accordingly, in a normal state (that is, in the case where the regular registers SR(1) to SR(n) are not broken), the first terminal a and the third terminal c of each of the switches S(1) to S(n+1) are connected, thereby the output terminals of the registers SR(1) to SR(n) are connected to the corresponding output lines L1 to Ln respectively. It is to be noted that the low voltage source is a ground potential $V_{GND}$ in this embodiment mode, however, it is needless to say that another potential may be employed.

Figure 6:
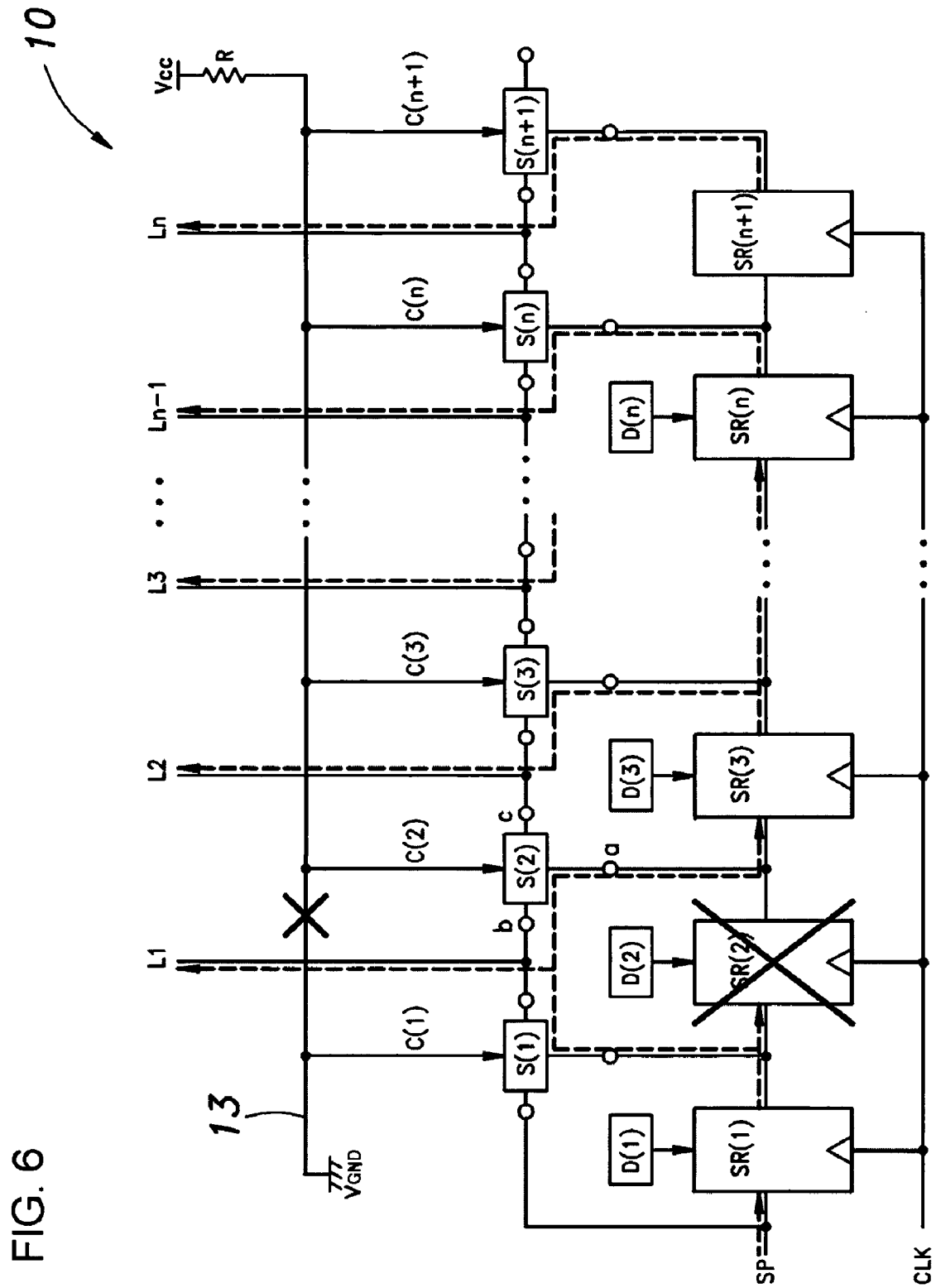
FIG. 6 is a circuit diagram showing an operation of the shift register in FIG. 4 in the case where one register is broken.

As shown in FIG. 6, in the case where the register SR(2) is broken (the broken register is crossed in the drawing), the control signal line 13 is cut off (shown by an X mark) between the switch S(2) corresponding to the broken register SR(2) and the switch S(1) of one upper stage. The control signal line 13 can be cut off by laser light irradiation, for example. Accordingly, control signals C(2) to C(n+1) to the switch S(2) and the switches S(3) to S(n+1) of lower stages become high ($V_{CC}$) and the first terminal a and the second terminal b of each of the switches S(2) to S(n+1) are connected. Accordingly, an output terminal of the register SR(1) is connected to an input terminal of the normal register SR(3) of lower stage by skipping the broken register SR(2). Moreover, output terminals of the registers SR(3) to SR(n) of lower stages than the broken register SR(2) are connected to output lines L2 to Ln−1 respectively which are one stage upper than those of the normal state. Further, an output terminal of the redundant register SR(n+1) is connected to the rest of the output line Ln. The broken register SR(2) is supplied with a disable signal from the corresponding disable circuit D(2) so that the broken register SR(2) does not affect the register SR(3) of the adjacent lower stage. Accordingly, it can be prevented that the broken register SR(2) affects a signal of the output line L1 connected to the normal register SR(1) of upper stage than the broken register SR(2). In this manner, the shift register 10 can operate normally even when the register SR(2) is broken. By connecting a control terminal of each of the switches S(1) to S(n+1) to the control signal line 13, an effect of the broken register can be eliminated by a simple operation to cut off one part of the control signal line 13, thereby the shift register 10 can operate normally.

Figure 7:
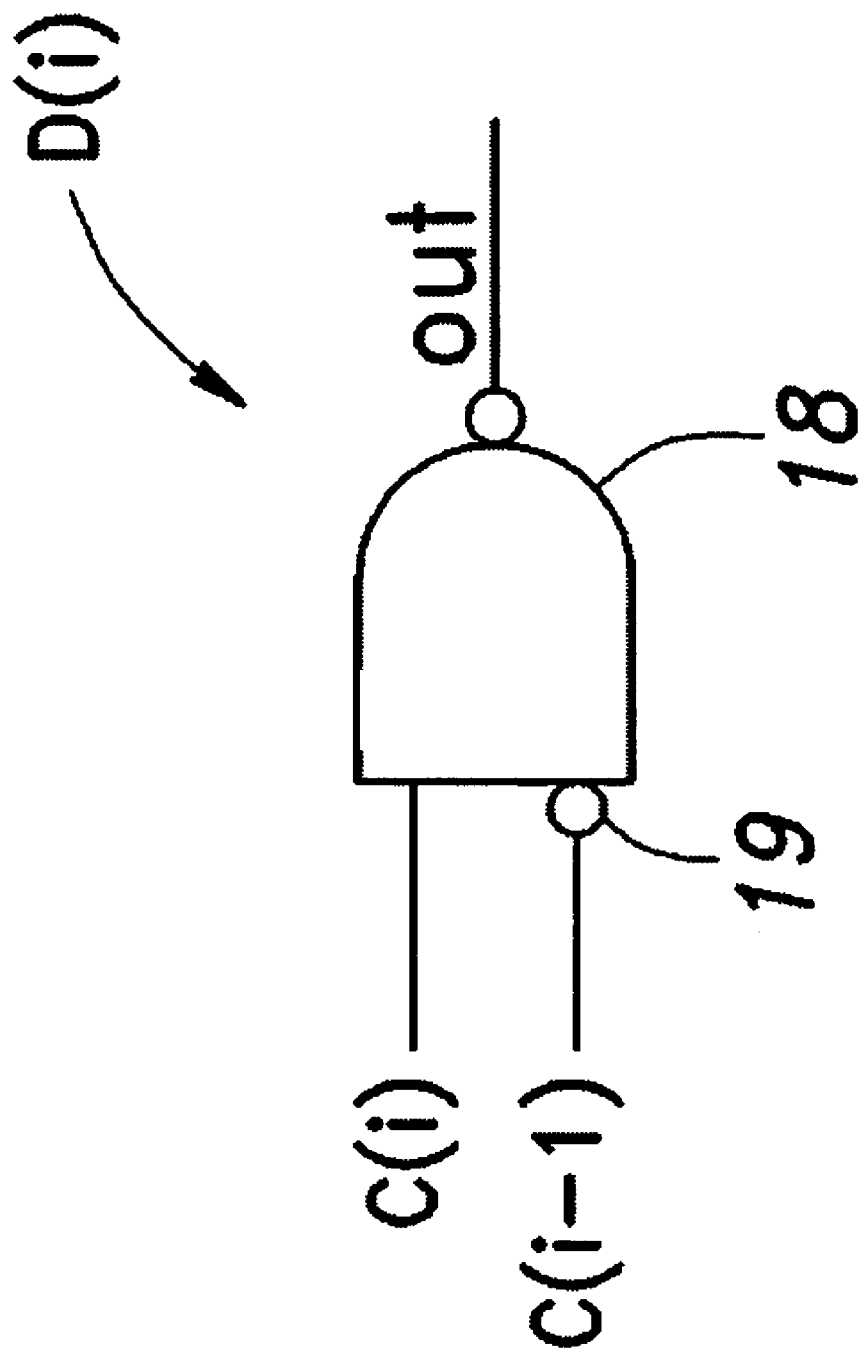
FIG. 7 is a circuit diagram showing a preferred embodiment mode of a disable circuit in FIG. 4.

The disable circuits D(1) to D(n) determines the states of the corresponding registers SR(1) to SR(n) from the states of the switches S(1) to S(n), then output disable signals when the register is determined to be broken. FIG. 7 is a circuit diagram showing a preferred embodiment mode of the disable circuit D(i) relatively to a register SR(i) of an i-th stage. The disable circuit D(i) is inputted with a control signal C(i) relatively to a corresponding switch S(i) and a control signal C(i−1) relatively to a switch S(i−1) of one upper stage. The control signal C(i) is inputted to one input terminal of a NAND gate 18 and the control signal C(i−1) is inputted to the other input terminal of the NAND gate 18 through an inverter circuit 19. Accordingly, when the control signal C(i) is high (logic 1) and the control signal C(i−1) is low (logic 0), the switch S(i) is determined to be broken, thus a logic 0 ($V_{GND}$) is outputted. In other cases, the switch S(i) is determined to be normal, thus a logic 1 ($V_{CC}$) is outputted. In other words, an output of logic 0 can be used as a disable signal here. It is to be noted that the disable circuit D(1) relatively to the register SR(1) of the input terminal is inputted with the control signal C(1) relatively to the corresponding switch S(1) and a ground potential $V_{GND}$.

Figure 8:
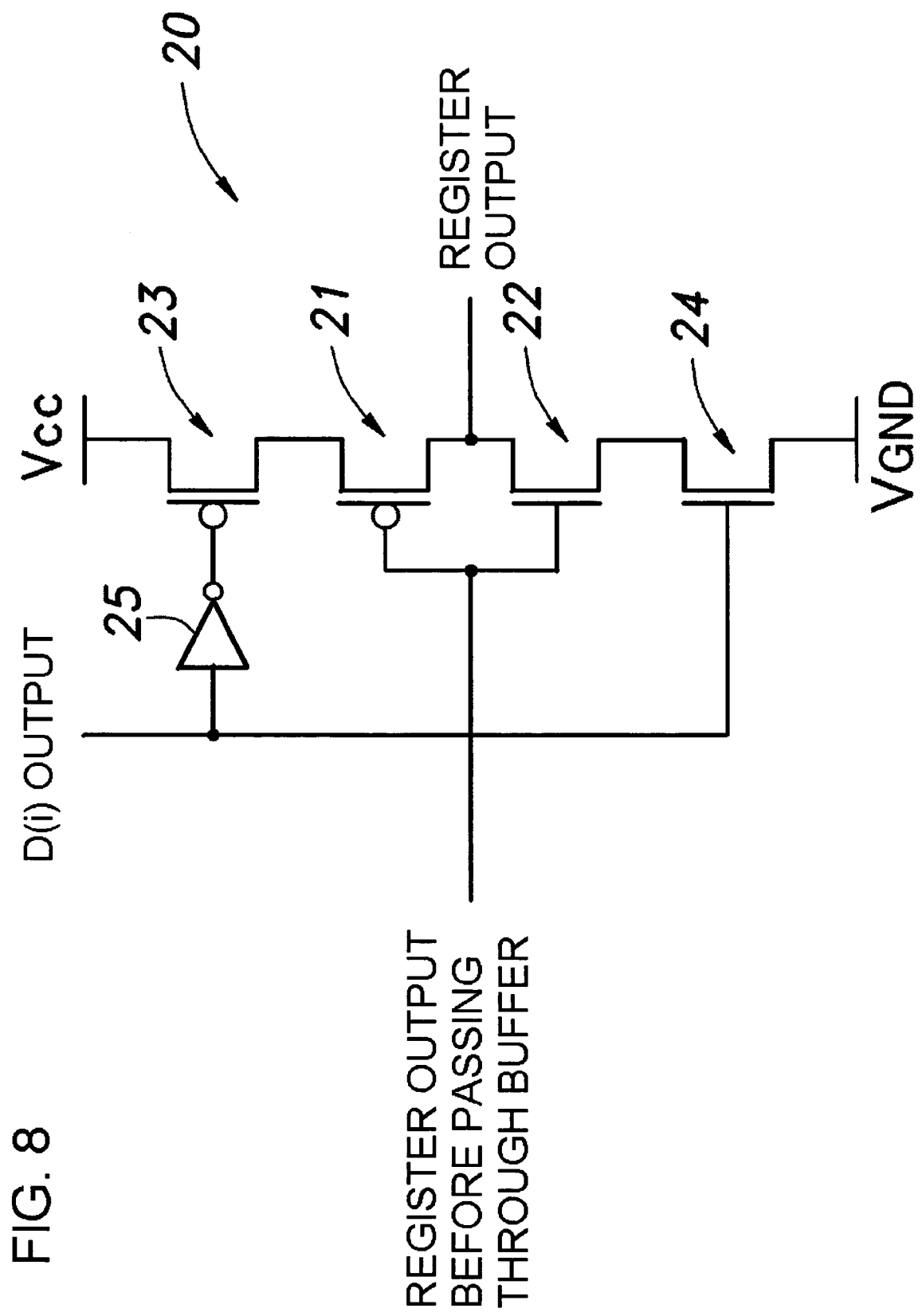
FIG. 8 is a circuit diagram showing a preferred embodiment mode of an output control of the shift register using a disable circuit.

FIG. 8 is a circuit diagram which can enable/disable a register SR(i) by using the disable circuit D(i) shown in FIG. 7. Normally, an output of the register SR(i) is sent to a register SR(i+1) of one lower stage through a buffer (inverter circuit) 20. In FIG. 8, a PMOS transistor 21 and an NMOS transistor 22 form a buffer 20. The PMOS transistor 21 is connected to an operation potential $V_{cc}$ through a control PMOS transistor 23 and the NMOS transistor 22 is connected to the ground potential $V_{GND}$ through a control NMOS transistor 24. An output terminal of the disable circuit D(i) shown in FIG. 7 is connected to a gate of the control PMOS transistor 23 through an inverter circuit 25 as well as to a gate of the control NMOS transistor 24 directly.

Accordingly, the control PMOS transistor 23 and the NMOS transistor 24 are turned on when the disable circuit D(i) outputs a logic 1, thereby an operation voltage is supplied to the buffer 20 of the register SR(i) and the buffer 20 becomes an operable state (enable state). On the other hand, when the disable circuit D(i) outputs a logic 0, the control PMOS transistor 23 and the control NMOS transistor 24 are turned off, thereby an operation voltage is not supplied to the buffer 20 and an output of the register SR(i) becomes electrically floating. Thus, a register SR(i+1) of lower stage and a signal of an output line connected to a register SR(i−1) of upper stage are not affected.

Figure 9:
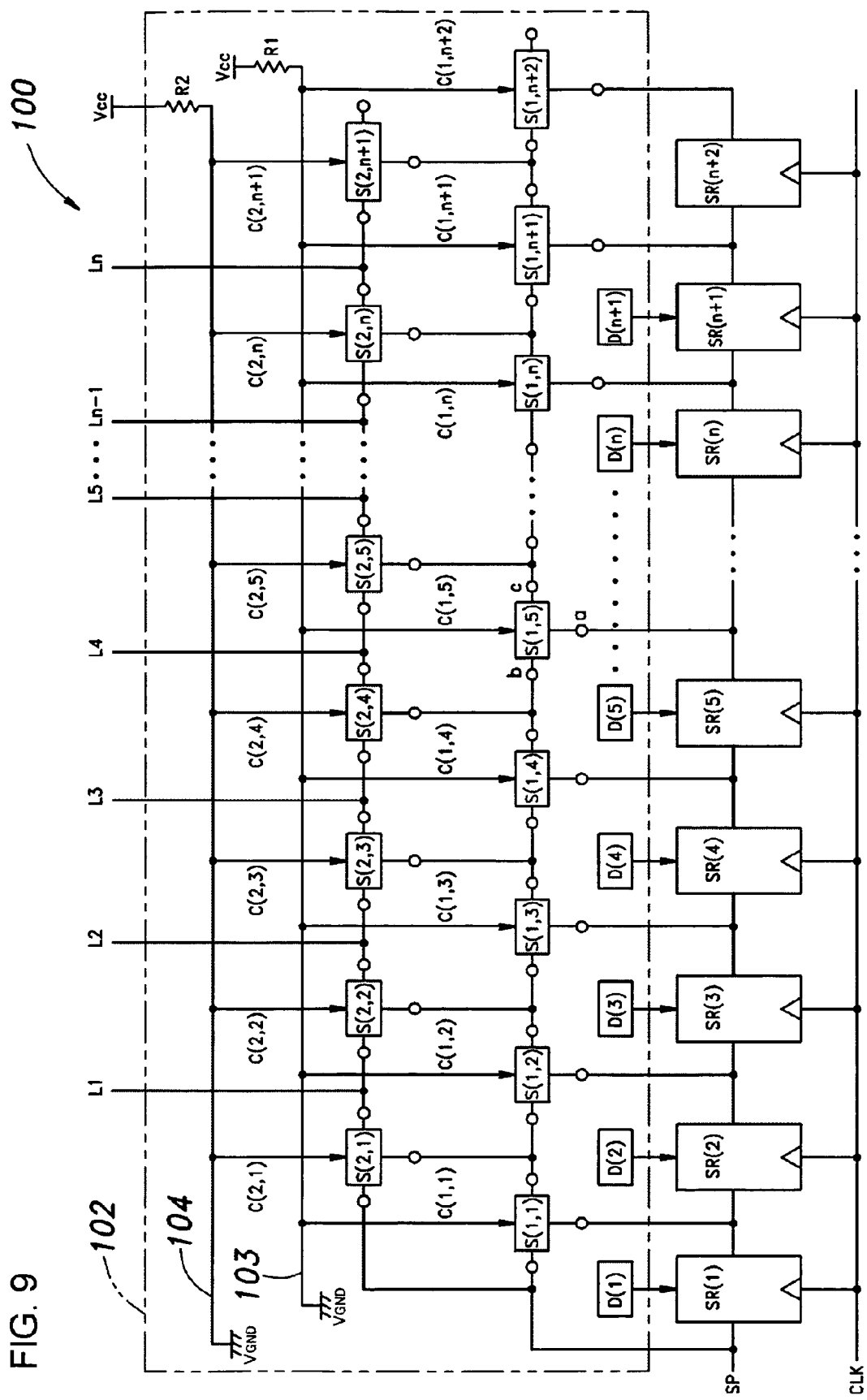
FIG. 9 is a schematic circuit diagram showing a preferred embodiment mode of the shift register of the invention which can operate normally with up to two broken registers.

FIG. 9 is a schematic circuit diagram showing a preferred embodiment mode of the shift register according to the invention, which can normally operate with up to two broken registers. The shift register 100 includes n regular registers SR(1) to SR(n) connected in series, n output lines L1 to Ln corresponding to the regular registers respectively, two redundant registers SR(n+1) and SR(n+2) connected in series to lower stage of the regular registers SR(1) to SR(n), and a switch circuit 102 which selectively connects the regular registers SR(1) to SR(n) and the redundant registers SR(n+1) and SR(n+2) to the output lines L1 to Ln respectively.

The switch circuit 102 includes (n+2) first switches S(1, 1) to S(1, n+2) connected to output terminals of the registers SR(1) to SR(n+2) respectively, (n+1) second switches S (2, 1) to S(2, n+1) provided between the first switches S(1, 1) to S(1, n+2) and the output lines L1 to Ln, the disable circuits D(1) to D(n+1) for supplying disable signals to the regular registers SR(1) to SR(n) and the redundant register SR(n+1) of lower stage, the first control signal line 103 for supplying the control signals C(1, 1) to C(1, n+2) to the first switches S(1, 1) to S(1, n+2), and the second control signal line 104 for supplying control signals C(2, 1) to C(2, n+1) to second switches S(2, 1) to S(2, n+1). Moreover, a clock signal CLK is supplied to the registers SR(1) to SR(n+2) and signals are sent from the registers of upper stage to the registers of lower stage in synchronization with the clock signal.

Similarly to the aforementioned embodiment mode, each of the first switches S(1, 1) to S(1, n+2) includes first, second, and third terminals a, b, and c and can selectively connect the first terminal a to one of the second terminal b and the third terminal c in accordance with the corresponding control signals C(1, 1) to C(1, n+2). Similarly, each of the second switches S(2, 1) to S(2, n+1) includes first, second, and third terminals a, b, and c and can selectively connect the first terminal a to one of the second terminal b and the third terminal c in accordance with the corresponding control signals C(2, 1) to C(2, n+1).

Each first terminal a of the first switches S(1, 1) to S(1, n+2) is connected to an output terminal of the corresponding registers SR(1) to SR(n+2), the second terminal b is connected to the third terminal c of the first switch of adjacent upper stage, the third terminal c is connected to the second terminal b of the adjacent first switch of lower stage and to the first terminal a of the corresponding second switches S(2, 1) to S(2, n+1). In this manner, adjacent first switches connected to each other form an array of switches. It is to be noted that a second terminal b of the first switch S(1, 1) of top stage is connected to an input terminal of the register SR(1) of the first stage, and a third terminal c of the first switch S(1, n+2) of bottom stage is open. Therefore, the first switch S(1, n+2) may be substituted by a switch having only the first terminal a and the second terminal b without the third terminal c.

Each second terminal b of the second switches S(2, 1) to S(2, n+1) is connected to the third terminal c of the second switch of adjacent upper stage and the third terminal c is connected to the second terminal b of the second switch of adjacent lower stage and to the corresponding output lines L1 to Ln. In this manner, the adjacent second switches connected to each other form an array of second switches. It is to be noted that a second terminal b of the second switch S(2, 1) of top stage is connected to an input terminal of the register SR(1) of a first stage, and a third terminal c of the switch S(2, n+2) of bottom stage is open. Therefore, the switch S(2, n+1) may be substituted by a switch having only the first terminal a and the second terminal b without the third terminal c.

Each of the first switches S(1, 1) to S(1, n+2) and the second switches S(2, 1) to S(2, n+1) can have a configuration shown in FIG. 5, for example. The first transmission gate 15 is on and the second transmission gate 16 is off when a control signal is high ($V_{CC}$) (that is, the first terminal a is connected to the second terminal b), and the first transmission gate 15 is off and the second transmission gate 16 is on when the control signal is low ($V_{GND}$) (that is, the first terminal a is connected to the third terminal c).

It is preferable that the first and second control signal lines 103 and 104 be formed of a conducting wire such as a fuse. Each control terminal of the first switches S(1, 1) to S(1, n+2) is connected to the first control signal line 103 sequentially from upper stage to lower stage. Similarly, each control terminal of the second switches S(2, 1) to S(2, n+1) is connected to the second control signal line 104 sequentially from upper stage to lower stage. One end of each of the first and second control signal lines 103 and 104 is connected to a ground potential $V_{GND}$ while the other end is connected to an operation potential $V_{CC}$ through resistors R1 and R2 respectively. Accordingly, in a normal state, the control signals C(1, 1) to C(1, n+2) of the first switches S(1, 1) to S(1, n+2) and the control signals C(2, 1) to C(2, n+1) of the second switches S(2, 1) to S(2, n+1) are low ($V_{GND}$). Accordingly, in a normal state (in the case where the regular registers SR(1) to SR(n) are not broken), the first terminal a and the third terminal c of each of the first switches S(1, 1) to S(1, n+2) and the second switches S(2, 1) to S(2, n+1) are connected, thereby the output terminals of the registers SR(1) to SR(n) are connected to the corresponding output lines L1 to Ln.

Figure 10:
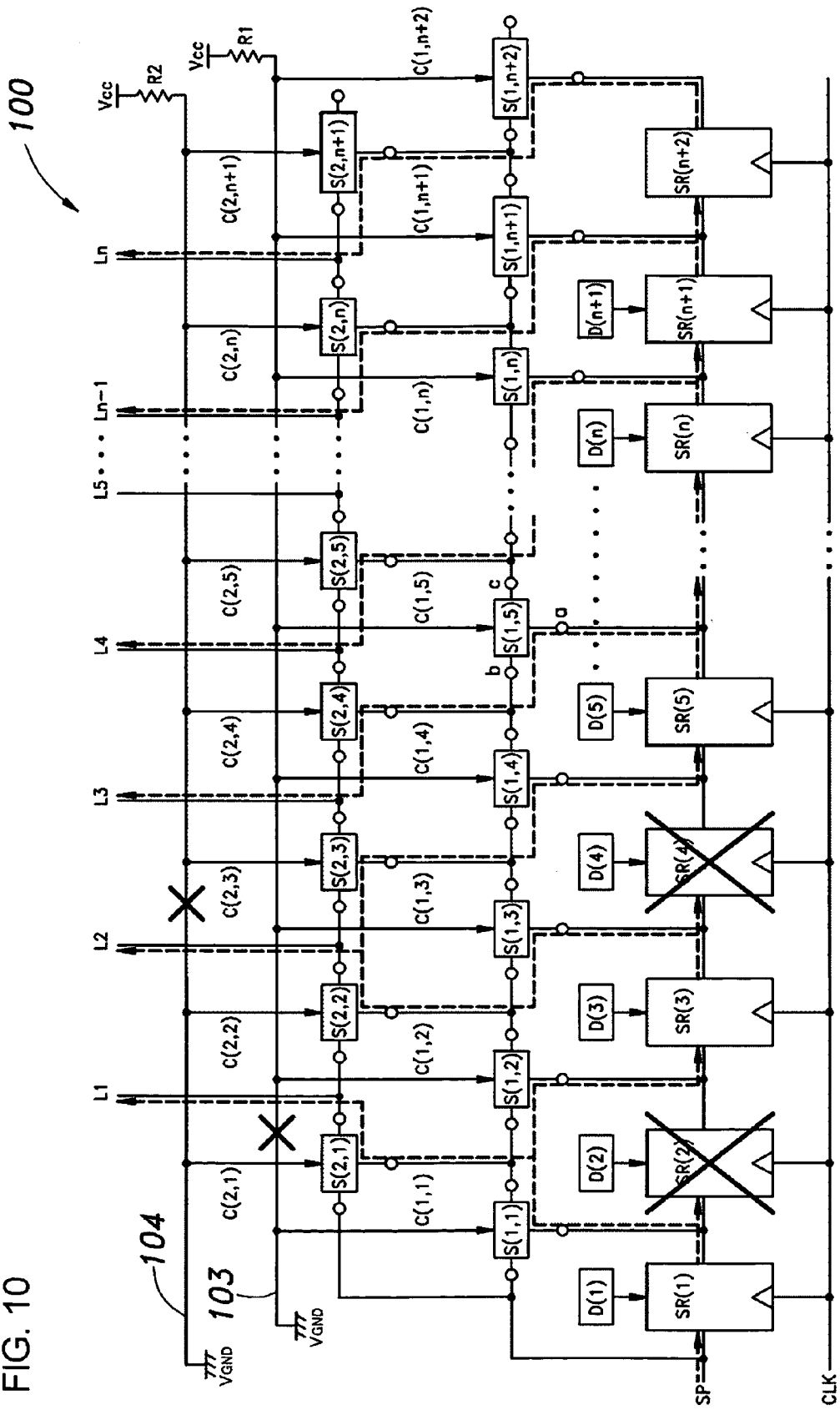
FIG. 10 is a circuit diagram showing an operation of the shift register in FIG. 9 in the case where two registers are broken.

FIG. 10 shows the case where the registers SR(2) and SR(4) are broken (the broken registers are crossed in the drawing). As shown in FIG. 10, the first control signal line 103 is cut off between the first switch S(1, 2) corresponding to the register SR(2) of upper stage of the two broken registers SR(2) and SR(4) and the first switch S(1, 1) of one upper stage. Accordingly, the control signals C(1, 2) to C(1, n+2) to the first switch S(1, 2) and the first switches S(1, 3) to S(1, n+2) of lower stages are high ($V_{CC}$), and the first terminal a and the second terminal b of each of the first switches S(1, 2) to S(1, n+2) are connected. Moreover, the second control signal line 104 is cut off between the second switch S(2, 3) and the second switch S(2, 2) of one upper stage, thereby control signals C(2, 3) to C(2, n+1) to the second switch S(2, 3) and the second switches S(2, 4) to S(2, n+1) of lower stages become high ($V_{CC}$) and the first terminal a and the second terminal b of each of the second switches S(2, 3) to S(2, n+1) are connected.

As a result of the aforementioned change in states of the first switches S(1, 2) to S(1, n+2) and the second switches S(2, 3) to S(2, n+1), the output terminal of the register SR(1) is connected to the input terminal of the normal register SR(3) by skipping the broken register SR(2). Similarly, the output terminal of the register SR(3) is connected to an input terminal of the normal register SR(5) by skipping the broken register SR(4). Moreover, an output terminal of the normal register SR(3) of lower stage than the broken register SR(2) is connected to the output line L2 of one stage upper than a normal state and output terminals of the normal registers SR(5) to SR(n) of lower stages than the broken register SR(4) are connected to the output lines L3 to Ln-2 of two stages upper than a normal state. Moreover, output terminals of the redundant registers SR(n+1) and SR(n+2) are connected to the rest of the output lines Ln-1 and Ln. Disable signals are supplied from the disable circuits D(2) and D(4) to the broken registers SR(2) and SR(4) so that outputs of the broken registers SR(2) and SR(4) do not affect the registers SR(3) and SR(5) of adjacent lower stages. Accordingly, it can also be prevented that the broken registers SR(2) and SR(4) affect signals of the output lines L1 and L2 connected to the normal registers SR(1) and SR(3) of upper stages thereof. In this manner, the shift register can operate normally even with the broken registers SR(2) and SR(4).

Figure 11:
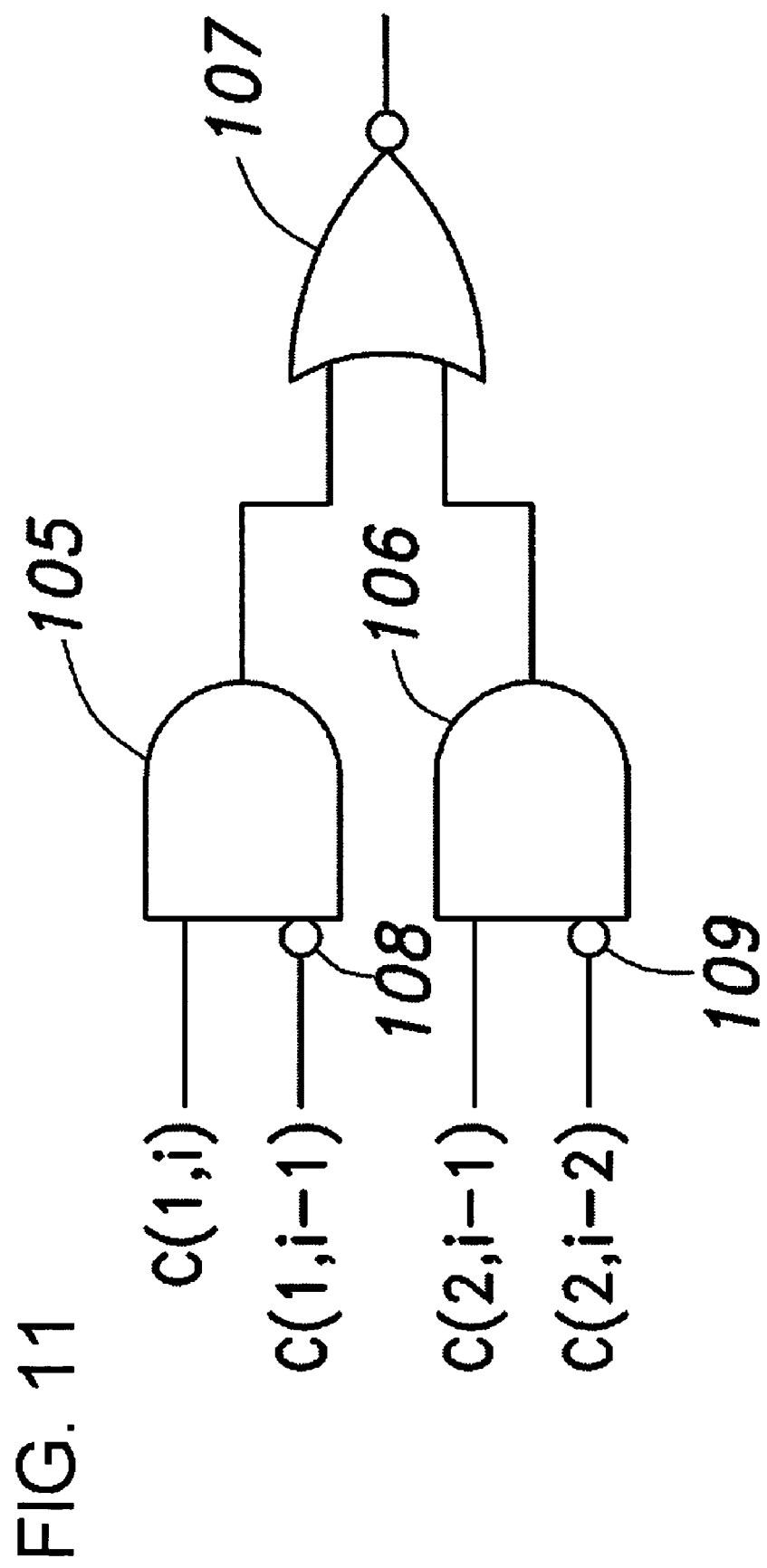
FIG. 11 is a circuit diagram showing a preferred embodiment mode of the disable circuit in FIG. 9.

The disable circuits D(1) to D(n+1) determines states of the registers SR(1) to SR(n+1) from the states of the first switches S(1, 1) to S(1, n+1) and the second switches S(2, 1) to S(2, n) and output disable signals when the register is determined to be broken. In the aforementioned embodiment mode, the states of the first switches S(1, 1) to S(1, n+2) are changed when two registers are broken (that is, an appropriate part of the first control signal line 103 is cur off). Accordingly, the broken register of upper stage is skipped and then the states of the second switches S(2, 1) to S(2, n+1) are changed (that is, an appropriate part of the second control signal line 104 is cut off) to skip the broken register of lower stage. FIG. 11 is a circuit diagram showing a preferred embodiment mode of the disable circuit D(i) relatively to the register SR(i) of i-th stage.

As shown in FIG. 11, the disable circuit includes first and second AND gates 105 and 106, and one NOR gate 107. The first AND gate 105 is inputted with a control signal C(1, i) relatively to the first switch S(i) and a control signal C(1, i−1) relatively to the first switch S(1, i−1) of one upper stage. The control signal C(1, i) is inputted to one input terminal of the first AND gate 105 and the control signal C(1, i−1) is inputted to the other input terminal of the first AND gate 105 through the inverter circuit 108. The second AND gate 106 is inputted with a control signal C(2, i−1) relatively to a second switch S(2, i−1) of one upper stage and a control signal C(2, i−2) relatively to the second switch S(2, i−2) of one upper stage thereof. The control signal C(2, i−1) is inputted to one input terminal of the second AND gate 106 and the control signal C(2, i−2) is inputted to the other input terminal of the second AND gate 106 through the inverter circuit 109. Outputs of the first and second AND gates 105 and 106 are inputted to the NOR gate 107. Accordingly, in the case where the controls signal C(1, i) is high (logic 1) and the control signal C(1, i−1) is low (logic 0) or the case where the control signal C(2, i−1) is high (logic 1) and the control signal C(2, i−2) is low (logic 0), the register SR(i) of i-th stage is determined to be broken, thereby logic 0 ($V_{GND}$) is outputted from the disable circuit D(i). In other cases, the register SR(i) is determined to be normal and logic 1 ($V_{CC}$) is outputted. It is to be noted that the disable circuit D(1) relatively to the register SR(1) of input terminal determines a state of the register SR(1) only from the control signal C(1, 1) relatively to the corresponding first switch S(1, 1). Moreover, as there is no C(2, i−2) corresponding to the disable circuit D(2) relatively to the register SR(2) of second stage, a ground potential $V_{GND}$ is inputted instead.

Figure 12:
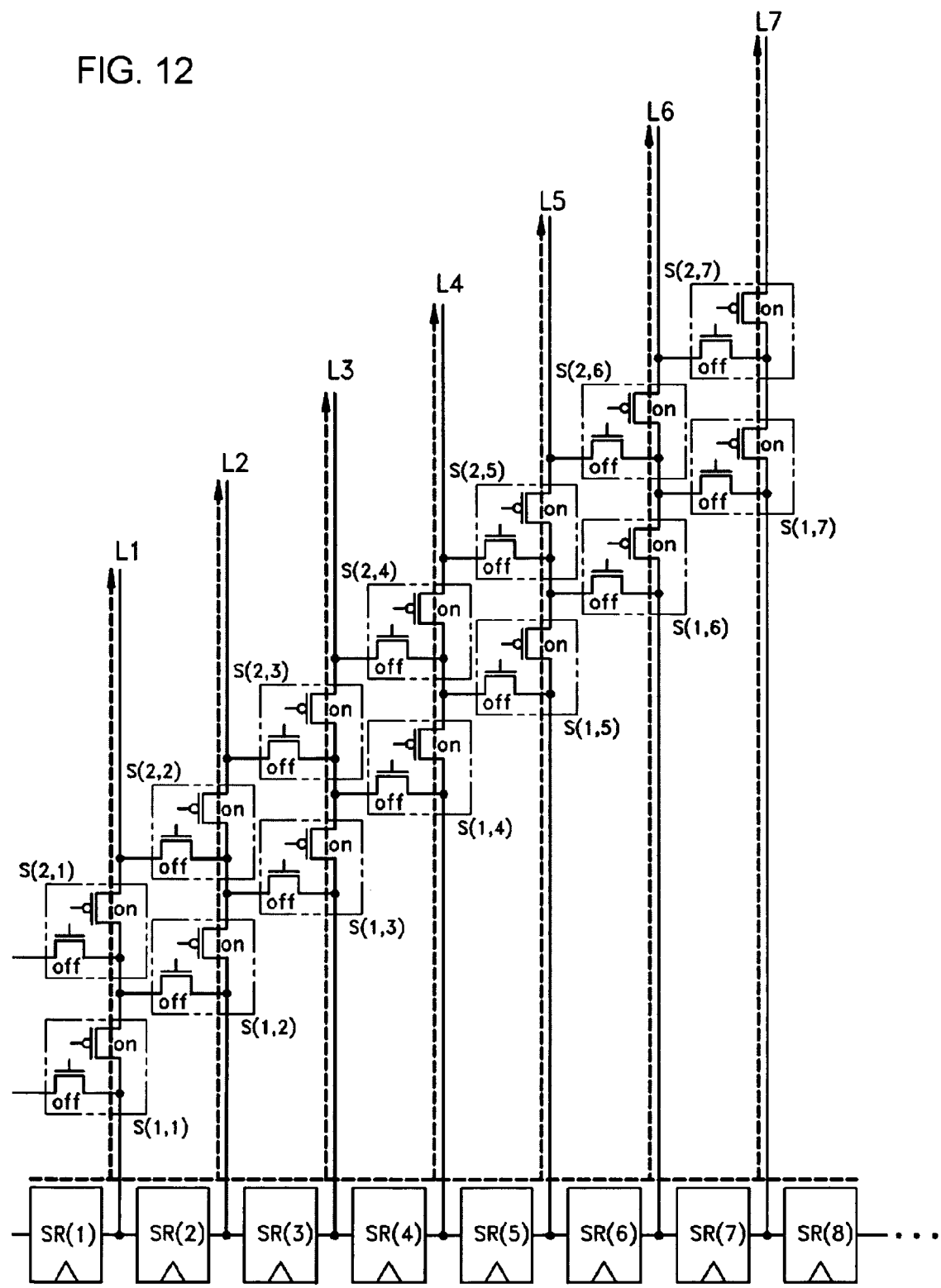
FIG. 12 is a circuit diagram showing a normal state of an embodiment mode in which each switch of the shift register in FIG. 9 is formed of a pair of a PMOS transistor and an NMOS transistor.

FIG. 12 is a schematic diagram showing an embodiment mode where the shift register 100 shown in FIG. 9 includes the first switches S(1, 1) to S(1, n+2) and the second switches S(2, 1) to S(2, n+1) each formed of a pair of a PMOS transistor and an NMOS transistor. It is to be noted that a control signal line, the disable circuits D(1) to D(n+1), and a clock signal line are not shown in FIG. 12.

As shown in FIG. 12, in a normal state (in the case where none of the regular registers SR(1) to SR(n) are not broken), an NMOS transistor is off and a PMOS transistor is on in each of the first switches S(1, 1) to S(1, n+2) and the second switches S(2, 1) to S(2, n+1). As shown by a broken line in FIG. 12, output terminals of the registers SR(1) to SR(n) are connected to the corresponding output lines L1 to Ln.

Figure 13:
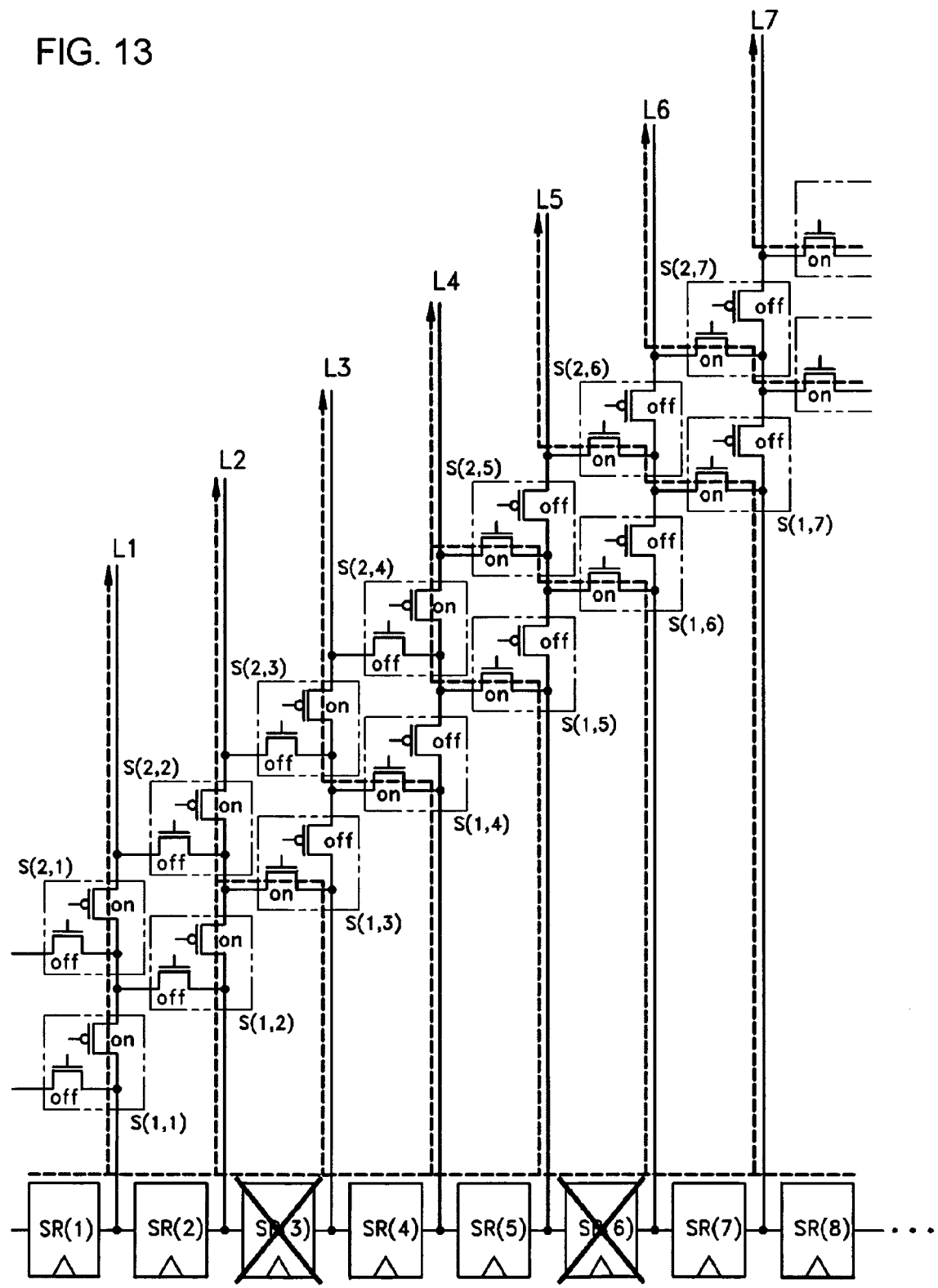
FIG. 13 is a circuit diagram showing an operation of the shift register in FIG. 12 in the case where two registers are broken.

As shown in FIG. 13, in the case where the registers SR(3) and SR(6) are broken, (the broken registers are crossed in the drawing) for example, an NMOS transistor is on and a PMOS transistor is off in the first switch S(1, 3) corresponding to the register SR(3) and the first switches S(1, 4) to S(1, n+2) of lower stages thereof. Moreover, an NMOS transistor is on and a PMOS transistor is off in the second switch S(2, 5) and the second switches S(2, 6) to S(2, n+1) of lower stages thereof. Accordingly, as shown by a broken line in FIG. 13, the broken registers SR(3) and SR(6) are skipped and signals are transmitted between normal registers. Further, signals are supplied to the output lines L1 to Ln through n normal registers including the two redundant registers SR(n+1) and SR(n+2), thereby the shift register can operate normally.

Figure 14:
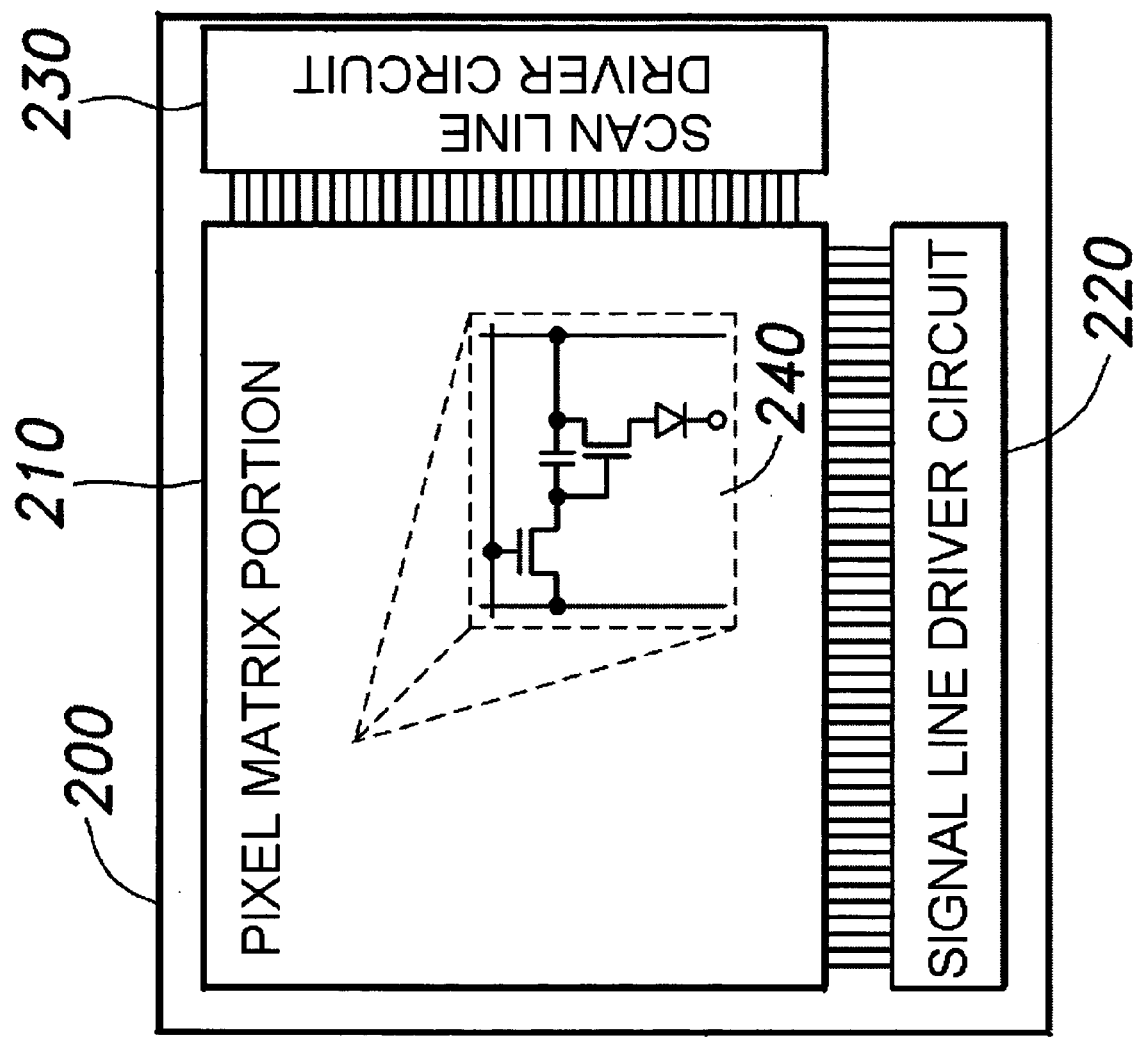
FIG. 14 is a block diagram showing a display device to which the shift register of the invention can be applied.

FIG. 14 is a schematic diagram of a display device to which the invention can be applied. A display device 200 includes a pixel matrix portion 210, a signal line driver circuit 220, and a scan line driver circuit 230. The pixel matrix portion 210 includes an organic EL element as a light emitting medium, and preferably includes a plurality of pixel cells 240 each having a PMOS transistor. It is to be noted that other transistors such as an NMOS transistor R can be used as well as a PMOS transistor. The aforementioned shift transistor of the invention can be used for one or both of the scan line driver circuit 230 and the signal line driver circuit 220, thereby the display device 200 which can normally function even with a broken register can be provided without much increase in manufacturing cost. It is needless to say that a liquid crystal display device using liquid crystals for the pixel matrix portion 210 can also be formed.

The invention can be applied to electronic devices such as a desktop, floor standing, or wall hanging display, a video camera, a digital camera, a goggle type display (head mounted display), a navigation system, an audio reproducing device (an in-car audio system, an audio component set, and the like), a computer, a game machine, a portable information terminal (a portable computer, a portable phone, a portable game player, an electronic book, and the like), and an image reproducing device provided with a recording medium (specifically, a device which reproduces an image or a still image recorded in a recording medium such as a Digital Versatile Disc (DVD) and includes a display capable of displaying the reproduced images). Specific examples of these electronic devices are shown in FIGS. 15A to 15H.

Figure 15A:
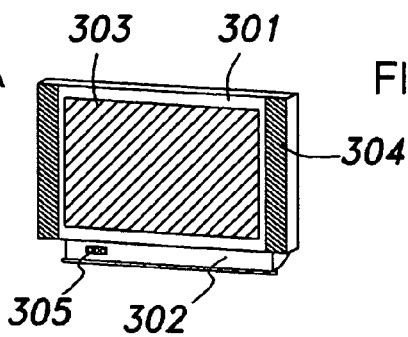
FIGS. 15A to 15H are perspective views of electronic devices to which the invention is applied.

FIG. 15A illustrates a desktop, floor standing, or wall hanging display which includes a housing 301, a support base 302, a display portion 303, a speaker portion 304, a video input terminal 305, and the like. The shift register of the invention can be applied to a driver circuit of the display portion 303. The display portion 303 can be formed of the display device 200 shown in FIG. 14, for example. Such a display can be used as an information display device for personal computer, TV broadcast reception, advertisement and the like. As a result, even when a register which forms a shift register in the driver circuit of the display portion is broken, a display can operate normally and a manufacturing yield can be improved.

Figure 15B:
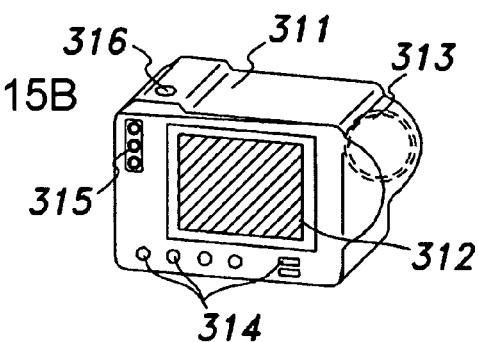

FIG. 15B illustrates a digital camera which includes a main body 311, a display portion 312, an image receiving portion 313, operating keys 314, an external connecting port 315, a shutter 316, and the like. The shift register of the invention can be applied to a driver circuit of the display portion 312. As a result, even when a register which forms a shift register in the driver circuit of the display portion is broken, a digital camera can operate normally and a manufacturing yield can be improved.

Figure 15C:
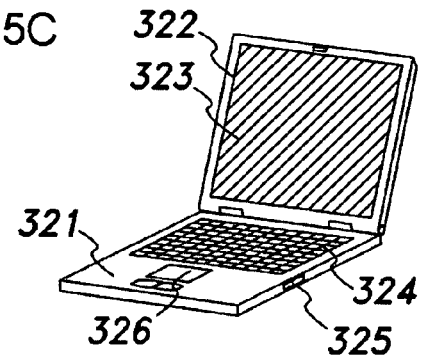

FIG. 15C illustrates a computer which includes a main body 321, a housing 322, a display portion 323, a keyboard 324, an external connecting port 325, a pointing mouse 326, and the like. The shift register of the invention can be applied to a driver circuit of the display portion 323. As a result, even when a register which forms a shift register in the driver circuit of the display portion is broken, a computer can operate normally and a manufacturing yield can be improved. It is to be noted that a computer includes what is called a notebook computer in which a central processing unit (CPU), a recording medium and the like are integrated and what is called a desktop computer in which they are separated.

Figure 15D:
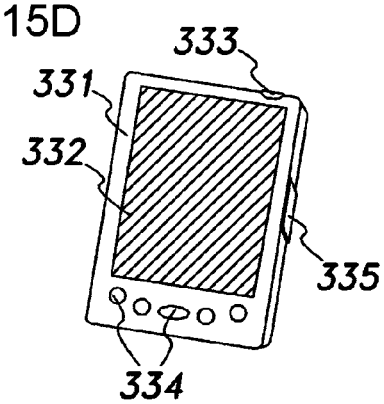

FIG. 15D illustrates a mobile computer which includes a main body 331, a display portion 332, a switch 333, operating keys 334, an infrared port 335, and the like. The shift register of the invention can be applied to a driver circuit of the display portion 332. As a result, even when a register which forms a shift register in the driver circuit of the display portion is broken, a mobile computer can operate normally and a manufacturing yield can be improved.

Figure 15E:
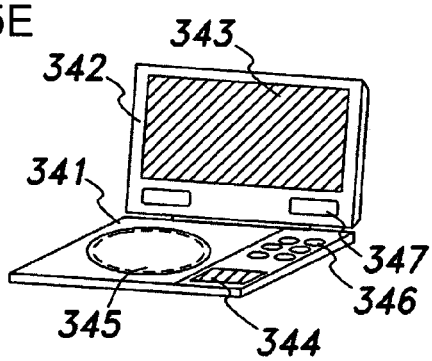

FIG. 15E illustrates a portable image reproducing device provided with a recording medium (specifically a DVD reproducing device), which includes a main body 341, a housing 342, a first display portion 343, a second display portion 344, a recording medium (such as a DVD) reading portion 345, an operating key 346, a speaker portion 347, and the like. The first display portion 343 mainly displays image data whereas the second display portion 344 mainly displays text data. The shift register of the invention can be applied to a driver circuit of the first and the second display portions 343 and 344. As a result, even when a register which forms a shift register in the driver circuit of the display portion is broken, a portable image reproducing device can operate normally and a manufacturing yield can be improved. It is to be noted that the image reproducing device provided with a recording medium includes a home game machine and the like.

Figure 15F:
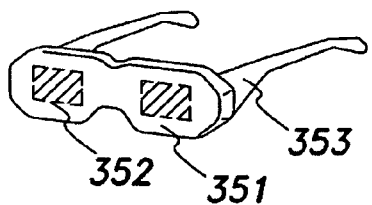

FIG. 15F illustrates a goggle type display (head mounted display) which includes a main body 351, a display portion 352, and an arm portion 353. The shift register of the invention can be applied to a driver circuit of the display portion 352. As a result, even when a register which forms a shift register in the driver circuit of the display portion is broken, a goggle type display can operate normally and a manufacturing yield can be improved.

Figure 15G:
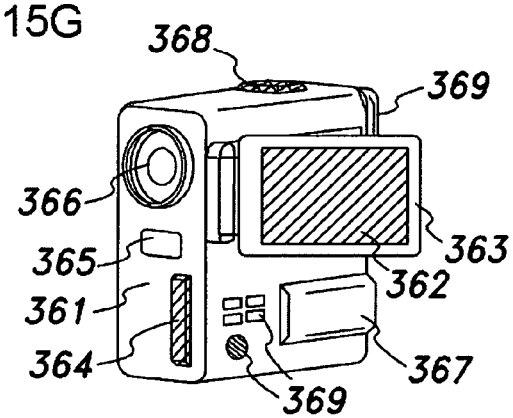

FIG. 15G illustrates a video camera which includes a main body 361, a display portion 362, a housing 363, an external connecting port 364, a remote control receiving portion 365, an image receiving portion 366, a battery 367, an audio input portion 368, operating keys 369, and the like. The shift register of the invention can be applied to a driver circuit which constitutes the display portion 362. As a result, even when a register which forms a shift register in the driver circuit of the display portion is broken, a video camera can operate normally and a manufacturing yield can be improved.

Figure 15H:
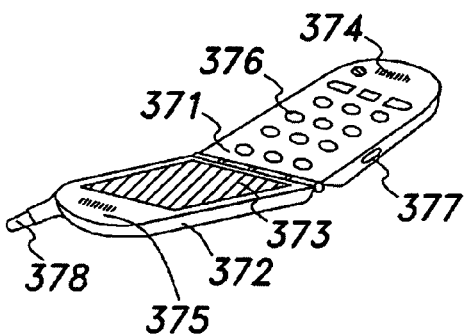

FIG. 15H illustrates a portable phone which includes a main body 371, a housing 372, a display portion 373, an audio input portion 374, an audio output portion 375, an operating key 376, an external connecting port 377, an antenna 378, and the like. The shift register of the invention can be applied to a driver circuit of the display portion 373. As a result, even when a register which forms a shift register in the driver circuit of the display portion is broken, a portable phone can operate normally and a manufacturing yield can be improved.

A display portion of the aforementioned electronic apparatuses may be a self-light emitting type using in each pixel a light emitting element such as an LED or an organic EL, or may be a liquid crystal display using another light source such as a backlight. In the case of the self-light emitting type, the display portion can be made thinner than that of the liquid crystal display without requiring a backlight.

The aforementioned electronic apparatuses are becoming to be more used for displaying data distributed through a telecommunication path such as Internet and a CATV (Cable Television System), and in particular used for displaying moving pictures. The self-light emitting display portion is suitable for displaying moving pictures since the light emitting material such as an organic EL can exhibit a remarkably high response. When the luminance of the light emitting material is improved in the future, it can be used for a front type or rear type projector by magnifying and projecting outputted light including image data by a lens and the like.

Since light emitting parts consume power in a self-light emitting display portion, data is desirably displayed so that the light emitting parts occupy as small area as possible. Accordingly, in the case where a self-light emitting type is adopted for a display portion that mainly displays text data, such as the one of a portable phone or an audio reproducing device, it is preferably operated so that the text data is displayed by light emitting parts using non-light emitting parts as background.

The invention can be applied to an arbitrary device using a shift register (for example, a memory array, a photo sensor and the like) as well as to a display device. According to the invention, manufacturing yield of these devices can be improved.

As described above, the invention can be widely applied to various electronic devices of all fields.

Although the invention has been fully described by way of example with reference to the accompanying drawings, it is to be understood that various changes and modifications will be apparent to those skilled in the art. Therefore, unless such changes and modifications depart from the scope of the invention, they should be construed as being included therein. For example, in the aforementioned embodiment mode, the ground potential $V_{GND}$ is supplied as a control signal for each switch in a normal state, however, the operation potential $V_{CC}$ can be supplied as well.

This application is based on Japanese Patent Application serial No. 2004-150284 filed in Japan Patent Office on May 20, 2004, the entire contents of which are hereby incorporated by reference.

What is claimed is:

1. A shift register comprising:

n (n≧1) regular registers connected in series;

n output lines;

r (n≧r≧1) redundant registers connected in series to the n regular registers; and a circuit for selectively connecting the n regular registers and the r redundant registers to the n output lines, wherein the circuit connects the n regular registers to the n output lines, wherein the circuit connects a normal regular register of an upper stage than an abnormal regular register to a normal regular register of a lower stage than the abnormal regular register by skipping the abnormal regular register, includes a disable circuit which disables the abnormal regular register, and connects the normal regular registers and at least one redundant register to the n output lines, and wherein the number of the redundant registers connected to the output line is the same number as that of the abnormal regular registers.

2. The shift register according to claim 1, wherein the circuit comprises (n+r) switches, wherein each of the (n+r) switches has a first terminal, a second terminal, a third terminal, and a control terminal, wherein the first terminal is selectively connected to one of the second and third terminals in accordance with a control signal inputted to the control terminal, wherein the first terminal is connected to one of the n regular registers and the r redundant registers, and wherein the third terminal of a switch of an upper stage and the second terminal of a switch of a lower stage are connected between a pair of adjacent switches.

3. The shift register according to claim 1, wherein the circuit comprises switches, and wherein a switch of a bottom stage comprises a first terminal and a second terminal.

4. The shift register according to claim 1, wherein the circuit comprises the disable circuit which disables the abnormal regular register which is determined to be broken from a state of the circuit.

5. The shift register according to claim 1, wherein the circuit comprises buffer circuits, wherein each of the buffer circuits is connected to one of the n regular registers and the r redundant registers, and wherein the disable circuit stops an operation voltage supply to the buffer circuit connected to the abnormal regular register and makes a terminal of the abnormal regular register electrically floating.

6. The shift register according to claim 1, wherein the circuit includes switches and a control signal line of which one end is connected to a low voltage source and the other end is connected to a high voltage source, wherein a control terminal of each of the switches is connected to the control signal line, wherein a voltage from one of the high voltage source and the low voltage source is supplied to the control terminal of each of the switches, and wherein the control signal line is cut off between a selected switch and a switch of one stage lower than the selected switch so that a voltage from the other of the high voltage source and the low voltage source is supplied as the control signal to lower stage switches than the selected switch.

7. The shift register according to claim 1, wherein the circuit includes switches and a control signal line, wherein a control terminal of each of the switches is connected to the control signal line, and wherein the control signal line comprises a fuse.

8. The shift register according to claim 1, wherein the shift register is incorporated in a display device.

9. The shift register according to claim 8, wherein the display device is incorporated in at least one selected from the group consisting of a digital camera, a mobile computer, an image reproducing device, a goggle type display, a video camera, a portable phone, and a navigation system.

10. A shift register comprising:

n (n≧1) regular registers connected in series;

n output lines;

one redundant register connected in series to the n regular registers; and a circuit for selectively connecting the n regular registers and the redundant register to the n output lines, wherein the circuit comprises (n+1) switches, wherein each of the (n+1) switches has a first terminal, a second terminal, a third terminal, and a control terminal, wherein the first terminal is selectively connected to one of the second and third terminals in accordance with a control signal inputted to the control terminal, wherein the first terminal is connected to one of the n regular registers and the redundant register, wherein the third terminal of a switch of an upper stage and the second terminal of a switch of a lower stage are connected between a pair of adjacent switches, wherein the circuit connects the n regular registers to the n output lines, and wherein the circuit connects a normal regular register of an upper stage than an abnormal regular register to a normal regular register of a lower stage than the abnormal regular register by skipping the abnormal regular register, includes a disable circuit which disables the abnormal regular register, and connects the (n−1) normal regular registers and the redundant register to the n output lines.

11. The shift register according to claim 10, wherein the shift register is incorporated in a display device.

12. The shift register according to claim 11, wherein the display device is incorporated in at least one selected from the group consisting of a digital camera, a mobile computer, an image reproducing device, a goggle type display, a video camera, a portable phone, and a navigation system.

13. A shift register comprising:

n (n≧1) regular registers connected in series;

n output lines;

two redundant registers connected in series to the n regular registers; and a circuit for selectively connecting the n regular registers and the two redundant registers to the n output lines, wherein the circuit comprises (n+2) first switches and (n+1) second switches, wherein each of the (n+2) first switches and the (n+1) second switches has a first terminal, a second terminal, a third terminal, and a control terminal, wherein the first terminal is selectively connected to one of the second and third terminals in accordance with a control signal inputted to the control terminal, wherein the first terminal of each of the (n+2) first switches is connected to one of the n regular registers and the two redundant registers, wherein the third terminal of a first switch of an upper stage and the second terminal of a first switch of a lower stage are connected between a pair of adjacent first switches, wherein the first terminal of each of the (n+1) second switches is connected to the third terminal of the first switch and the second terminal of the first switch of one stage lower, wherein the third terminal of a second switch of an upper stage switch and the second terminal of a second switch of a lower stage are connected between a pair of adjacent second switches, wherein the circuit connects the n regular registers to the n output lines, wherein the circuit connects a normal regular register of an upper stage than an abnormal regular register to a normal regular register of a lower stage than the abnormal regular register by skipping the abnormal regular register, includes a disable circuit which disables the abnormal regular register, and connects the normal regular registers and at least one redundant register to the n output lines, and wherein the number of the redundant registers connected to the output line is the same number as that of the abnormal regular registers.

14. The shift register according to claim 13, wherein the shift register is incorporated in a display device.

15. The shift register according to claim 14, wherein the display device is incorporated in at least one selected from the group consisting of a digital camera, a mobile computer, an image reproducing device, a goggle type display, a video camera, a portable phone, and a navigation system.

16. A shift register comprising:

n (n≧1) regular registers connected in series;

n output lines;

two redundant registers connected in series to the n regular registers; and a circuit for selectively connecting the n regular registers and the two redundant registers to the n output lines, wherein the circuit comprises (n+2) first switches and (n+1) second switches, wherein each of the (n+2) first switches and the (n+1) second switches has a first terminal, a second terminal, a third terminal, and a control terminal, wherein the first terminal is selectively connected to one of the second and third terminals in accordance with a control signal inputted to the control terminal, wherein the first terminal of each of the (n+2) first switches is connected to one of the n regular registers and the two redundant registers, wherein the third terminal of a first switch of an upper stage and the second terminal of a first switch of a lower stage are connected between a pair of adjacent first switches, wherein the first terminal of each of the (n+1) second switches is connected to the third terminal of the first switch and the second terminal of the first switch of one stage lower, wherein the third terminal of a second switch of an upper stage switch and the second terminal of a second switch of a lower stage are connected between a pair of adjacent second switches, wherein each of the n output lines is connected to the third terminal of one of the second switches and the second terminal of a second switch of one lower stage, wherein the circuit includes first and second control signal lines each having one end connected to a low voltage source and the other end connected to a high voltage source, wherein the control terminal of each of the (n+2) first switches is connected to the first control signal line, wherein a voltage from one of the high voltage source and the low voltage source is supplied to the control terminal of the first switch, wherein the control terminal of each of the second switches is connected to the second control signal line, wherein a voltage from one of the high voltage source and the low voltage source is supplied to the control terminal of the second switch, wherein the first control signal line is cut off between a selected first switch and a first switch of one stage lower so that a voltage from the other of the high voltage source and the low voltage source is supplied as the control signal to a first switch of lower stage than the selected first switch, wherein the second control signal line is cut off between a selected second switch and a second switch of one stage lower so that a voltage from the other of the high voltage source and the low voltage source is supplied as the control signal to a second switch of lower stage than the selected second switch, wherein the circuit connects the n regular registers to the n output lines, wherein the circuit connects a normal regular register of an upper stage than an abnormal regular register to a normal regular register of a lower stage than the abnormal regular register by skipping the abnormal regular register, includes a disable circuit which disables the abnormal register, and connects the normal regular registers and at least one redundant register to the n output lines, and wherein the number of the redundant registers connected to the output line is the same number as that of the abnormal regular registers.

17. The shift register according to claim 16, wherein at least one of the first control signal line and the second control signal line comprises a fuse.

18. The shift register according to claim 16, wherein the shift register is incorporated in a display device.

19. The shift register according to claim 18, wherein the display device is incorporated in at least one selected from the group consisting of a digital camera, a mobile computer, an image reproducing device, a goggle type display, a video camera, a portable phone, and a navigation system.

20. A shift register comprising:

n (n≧1) regular registers connected in series;

n output lines;

r (n≧r≧1) redundant registers connected in series to the n regular registers; and a circuit for selectively connecting the n regular registers and the r redundant registers to the n output lines, wherein the circuit connects i-th ($n \geqq i \geqq 1$) regular register and (i+2)-th regular register by skipping (i+1)-th regular register when the (i+1)-th regular register is an abnormal regular register, and includes a disable circuit which disables the (i+1)-th regular register, and wherein one of the r redundant registers is connected to one of the n output lines through the circuit.

21. The shift register according to claim 20, wherein the circuit comprises (n+r) switches.

wherein each of the (n+r) switches has a first terminal, a second terminal, a third terminal, and a control terminal, wherein the first terminal is selectively connected to one of the second and third terminals in accordance with a control signal inputted to the control terminal, wherein the first terminal is connected to one of the n regular registers and the r redundant registers, and wherein the third terminal of a switch of an upper stage and the second terminal of a switch of a lower stage switch are connected between a pair of adjacent switches.

22. The shift register according to claim 20, wherein the circuit comprises switches, and wherein a switch of a bottom stage comprises a first terminal and a second terminal.

23. The shift register according to claim 20, wherein the circuit comprises the disable circuit which disables the abnormal regular register which is determined to be broken from a state of the circuit.

24. The shift register according to claim 20, wherein the circuit comprises buffer circuits, wherein each of the buffer circuits is connected to one of the n regular registers and the r redundant registers, and wherein the disable circuit stops an operation voltage supply to the buffer circuit connected to the abnormal regular register and makes an output of the abnormal regular register electrically floating.

25. The shift register according to claim 20, wherein the circuit includes switches and a control signal line of which one end is connected to a low voltage source and the other end is connected to a high voltage source, wherein a control terminal of each of the switches is connected to the control signal line, wherein a voltage from one of the high voltage source and the low voltage source is supplied to the control terminal of each of the switches, and wherein the control signal line is cut off between a selected switch and a switch of one stage lower than the selected switch so that a voltage from the other of the high voltage source and the low voltage source is supplied as the control signal to lower stage switches than the selected switch.

26. The shift register according to claim 20, wherein the circuit includes switches and a control signal line, wherein a control terminal of each of the switches is connected to the control signal line, and wherein the control signal line comprises a fuse.

27. The shift register according to claim 20, wherein the shift register is incorporated in a display device.

28. The shift register according to claim 27, wherein the display device is incorporated in at least one selected from the group consisting of a digital camera, a mobile computer, an image reproducing device, a goggle type display, a video camera, a portable phone, and a navigation system.

* * * * *